United States Patent
Thyssen

(10) Patent No.: US 10,397,700 B2
(45) Date of Patent: Aug. 27, 2019

(54) SYSTEM AND METHOD FOR LOUDSPEAKER PROTECTION

(71) Applicant: Avago Technologies International Sales Pte. Limited, Singapore (SG)

(72) Inventor: Jes Thyssen, San Juan Capistrano, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/365,268

(22) Filed: Nov. 30, 2016

(65) Prior Publication Data

US 2017/0345438 A1   Nov. 30, 2017

Related U.S. Application Data

(60) Provisional application No. 62/343,517, filed on May 31, 2016, provisional application No. 62/415,026, (Continued)

(51) Int. Cl.
*H03G 3/30* (2006.01)
*H04R 3/00* (2006.01)
(Continued)

(52) U.S. Cl.
CPC .......... *H04R 3/007* (2013.01); *G10L 21/0232* (2013.01); *H03G 3/3005* (2013.01);
(Continued)

(58) Field of Classification Search
CPC .... H04R 9/06; H04R 1/1083; H04R 2430/03; H04R 2499/13; H04R 3/00; H04R 1/406;
(Continued)

(56) References Cited

U.S. PATENT DOCUMENTS 9,065,412 B2 * 6/2015 Wu ...................... H03G 3/3089
9,800,734 B2 * 10/2017 Kechichian .......... G10K 11/175
(Continued)

OTHER PUBLICATIONS

Bright, A., *Active Control of Loudspeakers: An Investigation of Practical Applications*, Ph.D. Thesis, Ørsted•DTU—Acoustic Technology, Technical University of Denmark, 2002, 203 pages.
(Continued)

*Primary Examiner* — Lun-See Lao
(74) *Attorney, Agent, or Firm* — Sterne, Kessler, Goldstein & Fox P.L.L.C.

(57) ABSTRACT

Systems, devices, and methods are described for providing loudspeaker protection and distortion suppression. An upstream loudspeaker model estimation component receives sensed electrical characteristics of a loudspeaker and generates an impedance model from which an excursion model of the loudspeaker and a gain change parameter may be generated. The impedance components are fitted to features of an estimated impedance, based on the sensed characteristics, to generate the estimated impedance model that is converted to an excursion model of the loudspeaker. A downstream audio signal processing component, based on the excursion model, or parameters thereof, limits a predicted excursion of the loudspeaker utilizing excursion-constraining processing circuitry that includes a non-linear constraint filter. Processed audio signals associated with the limited excursion are subject to distortion suppression prior to releasing the output audio signals for playback on the loudspeaker. Distortion suppression is performed based on a determined relationship between processed and pre-processed audio signals.

20 Claims, 7 Drawing Sheets

Related U.S. Application Data filed on Oct. 31, 2016, provisional application No. 62/423,292, filed on Nov. 17, 2016, provisional application No. 62/423,533, filed on Nov. 17, 2016.

(51) Int. Cl.

| | | |
|---|---|---|
| *H04R 3/04* | (2006.01) | |
| *H04R 9/06* | (2006.01) | |
| *H04R 29/00* | (2006.01) | |
| *G10L 21/0232* | (2013.01) | |
| *H03G 11/00* | (2006.01) | |

(52) U.S. Cl.
CPC ............... *H04R 3/04* (2013.01); *H04R 9/06* (2013.01); *H04R 29/001* (2013.01); *H04R 29/003* (2013.01); *H04R 2499/11* (2013.01)

(58) Field of Classification Search
CPC ............ H04R 2217/03; H04R 2410/01; H04R 29/00; H04R 29/004; H04R 19/02; H04R 1/023; H04R 1/1041; H04R 2225/41; H04R 2225/43; G10K 2210/1081; G10K 11/002; G10K 11/175; G10K 11/1784; G10K 11/1788; G10K 11/346; G10K 13/00; G10K 2210/108; G10K 2210/30232; G10K 2210/3028; G10K 2210/3045; G10K 2210/3046; G10K 2210/3056; H04S 3/00; H04S 3/006; H04S 7/30; H04S 7/301; H04S 7/303; H04S 7/304; H04S 7/306; H04S 7/307; H04W 28/14; H04W 4/003; H04W 4/005; H04W 4/026; H04W 4/16; H04W 4/185; H04W 4/22; H04W 76/023; H04W 88/02
USPC .................... 381/55–58, 96–100, 71.1, 71.8, 381/71.11–71.14, 103–106, 123; 181/144, 145
See application file for complete search history.

(56) References Cited

U.S. PATENT DOCUMENTS

| | | | |
|---|---|---|---|
| 9,837,971 B2 | 12/2017 | Luo et al. | |
| 2005/0175196 A1* | 8/2005 | Chen .................... | H04H 60/04 381/123 |
| 2010/0215193 A1 | 8/2010 | Wihardja et al. | |
| 2011/0095819 A1* | 4/2011 | Velazquez ............. | H03F 1/3247 330/149 |
| 2011/0178800 A1* | 7/2011 | Watts .................. | G10L 21/0208 704/233 |
| 2011/0228945 A1 | 9/2011 | Mihelich et al. | |
| 2012/0281844 A1 | 11/2012 | Luo et al. | |
| 2015/0003606 A1* | 1/2015 | Nemer .................. | H04M 3/002 379/406.01 |
| 2015/0304772 A1 | 10/2015 | Risberg et al. | |
| 2015/0304775 A1 | 10/2015 | Fujita | |
| 2016/0192070 A1 | 6/2016 | Bjoern-Josefsen et al. | |
| 2016/0241960 A1 | 8/2016 | Cheng et al. | |
| 2017/0318388 A1 | 11/2017 | Risberg et al. | |
| 2017/0318390 A1* | 11/2017 | Bjork ....................... | H04R 3/04 |
| 2017/0347188 A1 | 11/2017 | Thyssen | |
| 2017/0347189 A1 | 11/2017 | Thyssen | |
| 2017/0347190 A1* | 11/2017 | Thyssen ................. | H04R 3/007 |

OTHER PUBLICATIONS

Bright, A., "Discrete-time loudspeaker modelling," *Audio Engineering Society 114th Convention*, Amsterdam, The Netherlands, Mar. 22-25, 2003, 25 pages.

Henderson, H.V. and Searle, S.R., "On Deriving the Inverse of a Sum of Matrices," *Paper No. BU-647-M in the Biometrics Unit Series*, Jan. 1980, 21 pages.

Johnson, C.R., Jr., "Adaptive IIR filtering: Current Results and Open Issues," *IEEE Transactions on Information Theory*, vol. IT-30, No. 2, Mar. 1984, pp. 237-250.

Klippel, W., "Assessment of Voice-Coil Peak Displacement Xmax," *Journal of Audio Engineering Society*, vol. 51, No. 5, May 2003, 15 pages.

Klippel, W. and Seidel, U., "Fast and Accurate Measurement of Linear Transducer Parameters," *Audio Engineering Society 110th Convention*, Amsterdam, The Netherlands, May 12-15, 2001, 8 pages.

Klippel, W., "Large Signal Performance Drivers of Tweeters, Micro Speakers, and Horn Drivers," *Audio Engineering Society 118th Convention*, May 2005, 18 Pages.

Klippel, W., "Measurement of Large-Signal Parameters of Electrodynamic Transducer", *Audio Engineering Society 107th Convention*, New York, Sep. 24-27, 1999, 22 Pages.

Klippel, W., "Nonlinear losses in electro-acoustical transducers," *Proceedings of the Acoustics 2012 Nantes Conference*, Nantes, France, Apr. 23-27, 2012, pp. 3483-3488.

Klippel, W. et al., "The power of Loudspeaker Models," Workshop at Audio Engineering Society 117th Convention, San Francisco, Oct. 28-31, 2004, 50 Pages.

Klippel, W., "Tutorial: Loudspeaker Nonlinearities—Causes, Parameters, Symptoms," *Journal of the Audio Engineering Society*, vol. 54, No. 10, Oct. 2006, pp. 907-939.

Knudsen, M.H. et al., "Determination of Loudspeaker Driver Parameters Using a System Identification Technique," *Journal of the Audio Engineering Society*, vol. 37, No. 9, Sep. 1989, pp. 700-708.

Luo, C. et al., "A Model Based Excursion Protection Algorithm for Loudspeakers," *Proceedings ICASSP*, 2012, pp. 233-236.

Shynk, J.J., "Adaptive IIR Filtering", *IEEE ASSP Magazine*, Apr. 1989, pp. 4-21.

\* cited by examiner

SYSTEM AND METHOD FOR LOUDSPEAKER PROTECTION

CROSS-REFERENCE TO RELATED APPLICATIONS

The instant application claims priority to each of: U.S. Provisional Patent Application No. 62/423,533, entitled "System and Method for Loudspeaker Protection," filed on Nov. 17, 2016, U.S. Provisional Patent Application No. 62/343,517, entitled "System and Method for Loudspeaker Protection," filed on May 31, 2016, U.S. Provisional Patent Application No. 62/415,026, entitled "System and Method for Loudspeaker Protection," filed on Oct. 31, 2016, and U.S. Provisional Patent Application No. 62/423,292, entitled "System and Method for Loudspeaker Protection," filed on Nov. 17, 2016, the entirety of each of which is incorporated herein by reference.

BACKGROUND

I. Technical Field

Embodiments described herein relate to protection of loudspeakers during operation.

II. Background Art

Devices, such as personal computers and laptops, cellular and smart phones, wireless device accessories, headsets, personal digital assistants (PDAs), portable music players, handheld gaming devices, home electronics and entertainment devices, televisions, stand-alone loudspeaker units, etc., include loudspeakers, such as microspeakers, for reproduction or playback of an audio signal. Loudspeakers may suffer damage and/or failures from extended high-stress use and over-excursion scenarios. For example, extended use at high audio volume levels can cause breakdowns by melting the adhesives used to attach the voice coils in loudspeakers. High audio volume levels can also cause diaphragms of speakers to travel (i.e., undergo an excursion) beyond their mechanical capabilities resulting in permanent damage to the suspension of the loudspeaker. Existing solutions use linear filtering to constrain the amplitude of audio signals to mediate excursions based on a loudspeaker model. This constraint processing may introduce distortion into audio signals or excessively lower the perceived loudness of the audio signal.

BRIEF SUMMARY

Methods, systems, and apparatuses are described for loudspeaker protection, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1A:
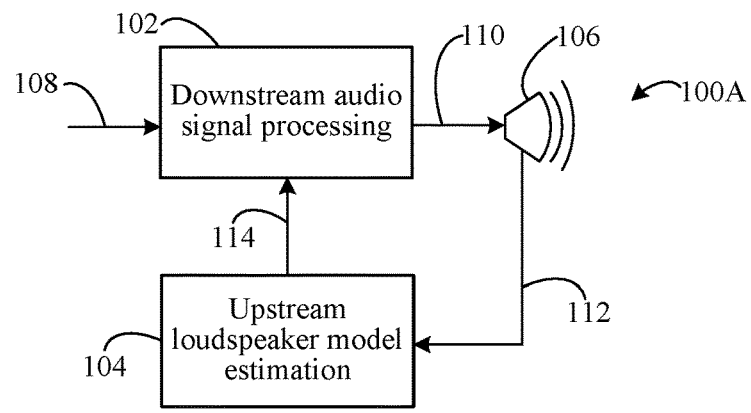
FIG. 1A shows a block diagram of a loudspeaker protection system, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Embodiments

The example techniques and embodiments described herein may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers, such as but not limited to microspeakers. While the embodiments herein may be described with respect to microspeakers as conceptual and/or illustrative examples for descriptive consistency, other types of loudspeakers are also contemplated for implementing the disclosed techniques. It is contemplated herein that in various embodiments and with respect to the illustrated figures of this disclosure, one or more components described and/or shown may not be included and that additional components may be included.

The techniques described herein provide novel loudspeaker protection systems, methods, and devices, such as in devices with loudspeakers, e.g., microspeakers, etc. The described techniques and embodiments provide for efficient, robust loudspeaker protection using upstream loudspeaker model estimation and downstream audio signal processing. For example, a loudspeaker protection system may include an upstream loudspeaker model estimation component and a downstream audio signal processing component.

An upstream loudspeaker model estimation component of an audio protection system according to embodiments is configured to provide component-based impedance model fitting of electrical characteristics of operating loudspeakers. That is, current and voltage characteristics of an operating loudspeaker may be sensed (e.g., during playback of general audio) to generate an impedance estimation. From this estimation, different impedance components, which comprise one or more respective impedance parameters, may be individually fit into an impedance model. Furthermore, some loudspeaker enclosures result in a secondary resonance which can also be reliably fit into the impedance model. In embodiments, separate excursion model conversion (to model excursions of operating loudspeakers) is provided by upstream loudspeaker model estimation components based on the impedance model. The described upstream loudspeaker model estimation components also seamlessly incorporate temperature prediction and corresponding gain modifiers into the loudspeaker protection systems herein.

A downstream audio signal processing component of an audio protection system according to embodiments is configured to utilize the gain modifiers generated by the upstream loudspeaker model estimation component to process an audio signal, e.g., reducing gain, to lower voice coil temperature to within acceptable operational ranges. A downstream audio signal processing component is also configured to perform signal processing to constrain loudspeaker excursion. The signal processing operates to constrain or limit, e.g., a diaphragm or cone excursion of a loudspeaker. The signal processing circuitry limits predicted excursions corresponding to audio signals using a non-linear constraint filter, which includes a limiter, and is based on the excursion model. The limiting is performed by processing the corresponding audio signals such that the resulting excursion is constrained using the non-linear constraint filter. The non-linear constraint filter includes an integral feed-back portion (i.e., inverse excursion model). The audio signals corresponding to the limited predicted excursion provide for the desired constrained excursions when a predicted excursion would exceed mechanical limitations. Limiting the excursion of the diaphragm of the loudspeaker mitigates, or eliminates, loudspeaker damage or failure due to the loudspeaker diaphragm traveling beyond its mechanical limits. Parameters for the excursion model (or the model itself) are received from the upstream estimation component, and are inserted in the non-linear constraint filter circuitry where the predicted excursion is constrained by the processing of the audio signal.

Processing techniques also provide for distortion suppression to suppress unwanted distortion introduced by the non-linear constraint filter on a frequency bin basis. An unwanted distortion may be one that creates an objectionable listening experience for a listener or user of the device. In embodiments, unwanted distortion may be based on one or more types of distortion meeting or exceeding a threshold. While diaphragm excursions are referred to herein, it is also contemplated that other excursions associated with loudspeakers, e.g., cone excursions, are contemplated herein, and the described techniques and embodiments are applicable thereto.

FIG. 1A shows a block diagram of a loudspeaker protection system 100A, according to an embodiment. Loudspeaker protection system 100A includes a downstream audio signal processing component 102 and an upstream loudspeaker model estimation component 104. Downstream audio signal processing component 102 and upstream loudspeaker model estimation component 104 may perform functions as described above. Upstream loudspeaker model estimation component 104 is configured to receive sensed electrical characteristics, or indicia thereof, of a loudspeaker 106 via a connector 112 when loudspeaker 106 is operating, i.e., reproducing audio sounds. Upstream loudspeaker model estimation component 104 is configured to generate an excursion model and a gain modifier for providing to downstream audio signal processing component 102 via a connector 114. Downstream audio signal processing component 102 is configured to receive an audio signal via a connector 108 and perform audio signal processing according to the excursion model and/or gain modifier, in embodiments, and is configured to perform distortion suppression of audio signals, in embodiments, for audio signal outputs provided for playback by loudspeaker 106 via a connector 110.

In embodiments, upstream loudspeaker model estimation component 104 does not perform processing of audio signals, while downstream audio signal processing component 102 performs all audio signal processing. Additionally, upstream loudspeaker model estimation component 104 is configured to update and provide the excursion model and the gain modifier to downstream audio signal processing component 102 asynchronously with respect to the operation of downstream audio signal processing component 102, e.g. the downstream processing component 102 may be block based, for instance, with a 10 ms frame, i.e., a frame-rate of 1 frame per 10 ms, while the upstream component 104 provides parameters to the downstream processing component less frequently or at a slower rate, but typically on a downstream frame boundary. Upstream loudspeaker model estimation component 104 and downstream audio signal processing component 102 may be implemented in hardware, firmware, software, or any combination thereof. In one embodiment, downstream audio signal processing component 102 is implemented as electrical hardware and upstream loudspeaker model estimation component 104 is implemented as a combination of hardware, firmware, and software.

As noted above, loudspeaker protection system 100A may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers. It should be understood that the connections described above may comprise one or more connections that are related to or separate from each other. Further embodiments and details relating to loudspeaker protection systems, downstream audio signal processing component 102, and upstream loudspeaker model estimation component 104 are described elsewhere herein.

Figure 1B:
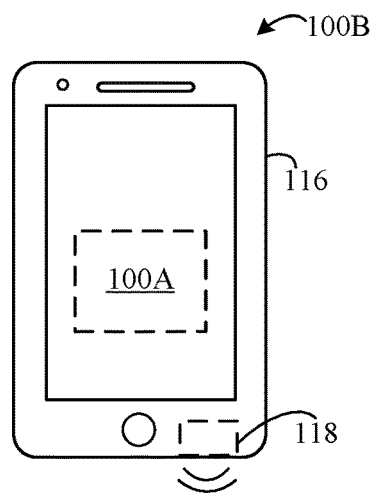
FIG. 1B shows a device that includes the loudspeaker protection system of FIG. 1A, according to an example embodiment.

FIG. 1B shows a device 100B that includes loudspeaker protection system 100A of FIG. 1A, according to an embodiment. While device 100B is shown as a smartphone, other types of devices described herein are also contemplated according to embodiments. Device 100B includes a base structure 116. Base structure 116 includes buttons and/or other types of user interfaces, cameras, and microphones, as well as processing and communication circuitry, memory, and/or the like, commonly found in smartphones as would be understood by one of skill in the relevant art(s) having the benefit of this disclosure. Base structure 116 may also include an enclosure 118 having an aperture through which sound of a loudspeaker (e.g., loudspeaker 106 of FIG. 1A) is emitted. Enclosure 118 may encompass or substantially encompass the loudspeaker, and may result in a secondary resonance during operation of the loudspeaker.

Referring back to FIG. 1A, loudspeaker 106 may be any type of loudspeaker, such as a microspeaker (a thin electro-dynamic loudspeaker), and more than one loudspeaker may be included in a device, according to embodiments. In such embodiments, the embodiments and techniques described herein may be applied to one or more loudspeakers of a device.

Figure 1C:
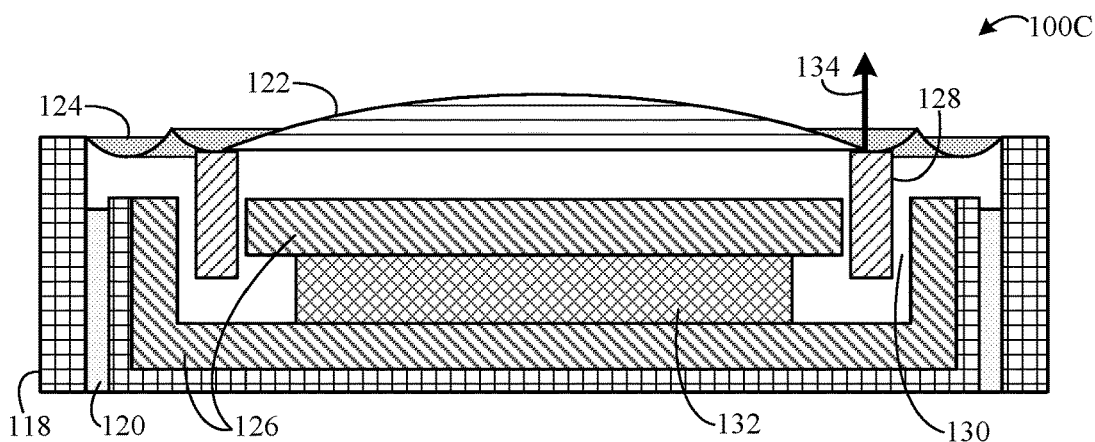
FIG. 1C shows a diagram of a cross-section of a microspeaker, according to an example embodiment.

Turning now to FIG. 1C, a diagram of a cross-section of a microspeaker 100C is shown, according to an embodiment. Microspeaker 100C may be a further embodiment of loudspeaker 106 of FIG. 1A, and may be included in enclosure 118 of FIG. 1B in embodiments. Microspeaker 100C includes a frame 118 having one or more ventilation passages 120. Frame 118 supports magnetic circuits 126 and a suspension 124, and a magnet 132 is included between magnetic circuits 126, e.g., as shown in FIG. 1C. A voice coil 128 is attached via adhesive to a diaphragm 122. A magnetic field is applied in a gap 130 between voice coil 128 and magnetic circuits 126 resulting in voice coil 128 exerting a force $f_x$ on diaphragm 122 causing diaphragm 122 to travel a distance $x_d$ (i.e., an excursion or displacement). The force $f_x$ and the distance $x_d$ are denoted as a vector 134. The magnitude of $f_x$ and length of $x_d$ correlate to the magnetic field and its associated voltage of an audio signal being played back by microspeaker 100C. If excessive force is applied as $f_x$, or applied for an extended period of time, diaphragm 122 of microspeaker 100C may travel beyond its mechanical limits (i.e., an excursion with a distance $x_d$) resulting in damage or failure of microspeaker 100C. Furthermore, adhesives used to attach voice coil 128 to diaphragm 122 and/or suspension 124 may slowly break down or melt with rising temperatures of voice coil 128. Accordingly, the techniques and embodiments described herein provide for improvements in the protection of loudspeakers as described above, including but not limited to microspeakers.

For instance, methods, systems, devices, and apparatuses are provided for improved loudspeaker protection. A system comprising distortion suppression circuitry to suppress distortion in audio signals in accordance with an example aspect is described. The distortion suppression circuitry is configured to receive a pre-processed representation of an audio signal, receive a post-processed representation of the audio signal, and determine a first characteristic of the pre-processed representation of the audio signal and a second characteristic of the post-processed representation of the audio signal. The distortion suppression circuitry is also configured to, for each of a plurality of corresponding, respective portions of the pre-processed representation and of the post-processed representation, select the corresponding pre-processed representation when a difference between a value of the first characteristic and a value of the second characteristic is within a first range of characteristic values, and select the post-processed representation when the difference between the value of the first characteristic and the value of the second characteristic is within a second range of characteristic values. The distortion suppression circuitry is further configured to generate an output audio signal comprised of the selected portions of the plurality of corresponding, respective portions.

A method for suppressing distortion in an audio signal in accordance with another example aspect is described. The method includes receiving a pre-processed representation of the audio signal, receiving a post-processed representation of the audio signal, and determining a first characteristic of the pre-processed representation of the audio signal and a second characteristic of the post-processed representation of the audio signal. The method also includes, for each of a plurality of corresponding, respective portions of the pre-processed representation and of the post-processed representation, selecting the corresponding pre-processed representation when a difference between a value of the first characteristic and a value of the second characteristic is within a first range of characteristic values, and select the post-processed representation when the difference between the value of the first characteristic and the value of the second characteristic is within a second range of characteristic values. The method further includes generating an output audio signal comprised of the selected portions of the plurality of corresponding, respective portions.

A computer readable storage device in accordance with yet another example aspect is also described. The computer readable storage device comprises a storage medium encoded with program instructions that, when executed by a computing device, cause the computing device to perform a method for suppressing distortion in an audio signal. The program instructions include first instructions for receiving a pre-processed representation of the audio signal and receiving a post-processed representation of the audio signal. The program instructions also include third instructions for selecting, for each of a plurality of corresponding, respective portions of the pre-processed representation and of the post-processed representation, the corresponding pre-processed representation when a difference between a value of the first characteristic and a value of the second characteristic is within a first range of characteristic values, and select the post-processed representation when the difference between the value of the first characteristic and the value of the second characteristic is within a second range of characteristic values. The program instructions further include fourth instructions for generating an output audio signal comprised of the selected portions of the plurality of corresponding, respective portions.

Various example embodiments are described in the following subsections. In particular, example upstream loudspeaker model estimation embodiments are described. This description is followed by downstream audio signal processing embodiments. Next, further example embodiments and advantages are described, and subsequently an example computing device implementation is described. Finally, some concluding remarks are provided. It is noted that the division of the following description generally into subsections is provided for ease of illustration, and it is to be understood that any type of embodiment may be described in any subsection.

III. Example Upstream Loudspeaker Model Estimation Embodiments

As noted above, systems for protection of loudspeakers, such as microspeakers, along with their components such as upstream loudspeaker model estimation components, may be configured in various ways to provide loudspeaker protection.

In embodiments, by way of illustrative example and not limitation, an upstream loudspeaker model estimation component comprises one or more subcomponents configured to fit parameters of an impedance model of a loudspeaker during operation, generate an excursion model, predict a temperature of a voice coil of the loudspeaker, and generate a gain change parameter. These functions of the upstream loudspeaker model estimation component may be based, at least in part, on sensed electrical characteristics, or indicia thereof, of the loudspeaker during its operation.

Figure 2:
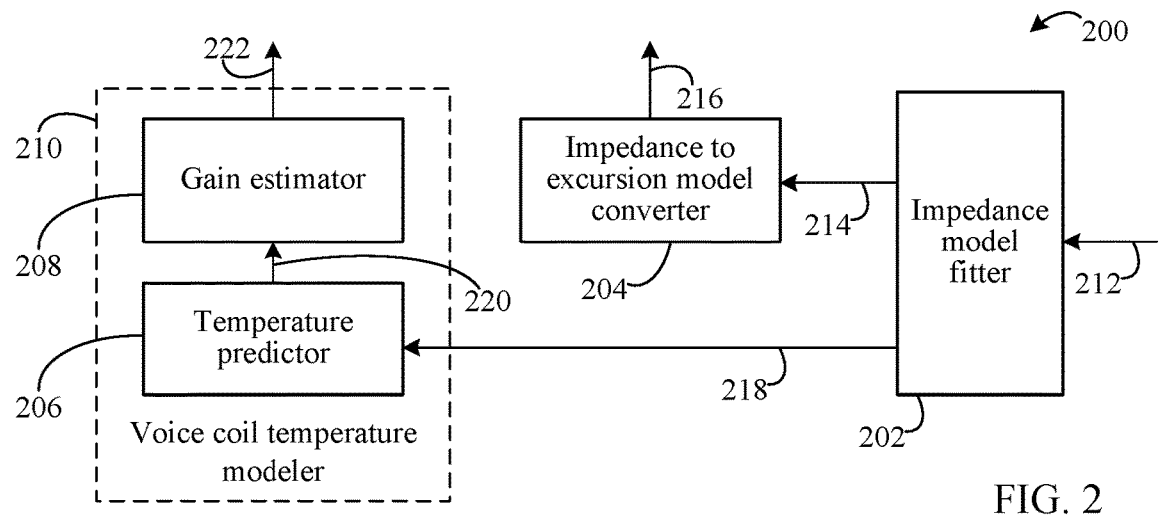
FIG. 2 shows a block diagram of an upstream loudspeaker model estimation component of a loudspeaker protection system, according to an example embodiment.
Figure 3:
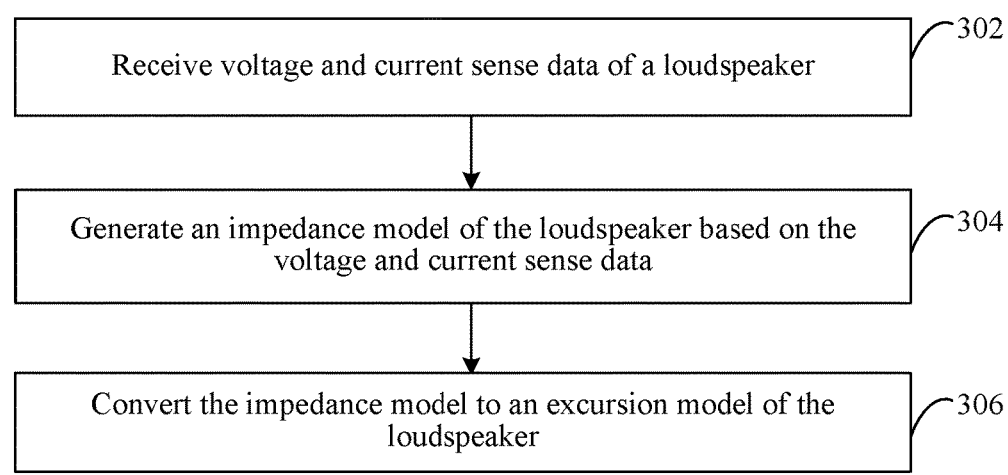
FIG. 3 shows a flowchart for model generation by the upstream loudspeaker model estimation component of FIG. 2, according to an example embodiment.

FIG. 2 shows a block diagram of an upstream loudspeaker model estimation component 200 of a loudspeaker protection system, according to an embodiment. Upstream loudspeaker model estimation component 200 may be a further embodiment of upstream loudspeaker model estimation component 104 of FIG. 1A. Upstream loudspeaker model estimation component 200 includes an impedance model fitter 202, an impedance to excursion model converter 204, a temperature predictor 206, and a gain estimator 208. In embodiments, temperature predictor 206 and gain estimator 208 may together comprise a voice coil temperature modeler 210.

Impedance model fitter 202 is configured to receive voltage and current sense data for a loudspeaker and/or a voice coil thereof, such as loudspeaker 106 of FIG. 1A, via a connector 212 from a voltage sensor and a current sensor (not shown) electrically coupled to the loudspeaker. The received voltage and current sense data are operational data sensed during operation of the loudspeaker, e.g., during playback of audio, according to embodiments, and may be voltage and current sense data of a voice coil of the loudspeaker. In embodiments, indicia of the voltage and current sense data may be received.

Impedance model fitter 202 is configured to generate the impedance model of the loudspeaker based on the voltage and current sense data. That is, based on the received sense data, or indicia, an impedance estimate may be generated, e.g., according to impedance 'Z' being equal to voltage 'U' divided by current 'I' as a function of frequency:

$$U(s)=I(s)Z(s), \quad \text{(Eq. 1)}$$

solving for Z, $$|Z(s)| = \frac{|U(s)|}{|I(s)|}. \quad \text{(Eq. 2)}$$

The impedance model may include one or more components (or impedance components) such as resistivity, inductance, primary resonance, and secondary resonance. The parameters of the components are estimated by fitting the impedance model to the impedance estimate (the observed impedance of the loudspeaker calculated from the sensed voltage and current during general audio playback).

Impedance to excursion model converter 204 is configured to convert the impedance model to an excursion model of the loudspeaker. Impedance to excursion model converter 204 is configured to receive the impedance model from impedance model fitter 202, via a connector 214, and to generate the excursion model based on the conversion of one or more components of the impedance model, and a force factor 'φ' of the loudspeaker that may be provided by a manufacturer or derived from operation of the loudspeaker. In embodiments, the excursion model may be generated by conversion with or without taking the secondary resonance component into account.

The excursion model generated by conversion at impedance to excursion model converter 204 may be provided via a connector 216 to downstream processing circuitry or a downstream processing component, such as in downstream audio signal processing component 102 of FIG. 1A for use in the processing of audio signals.

For instance, impedance model fitter 202 may include an impedance estimator, a component fitting elements for resistivity, inductance, primary resonance, and resonance component. Impedance model fitter 202 may also be configured to determine or generate lumped parameters in some configurations. Impedance model fitter 202 may be configured to receive voltage sense data and current sense data for a loudspeaker and/or a voice coil thereof, such as loudspeaker 106 of FIG. 1A. Voltage sense data and current sense data may be received from a voltage sensor and a current sensor (not shown) electrically coupled to the loudspeaker. The received voltage sense data and current sense data are operational data sensed during operation of the loudspeaker, e.g., during playback of audio, according to embodiments, and may be sensed voltage and current data of a voice coil of the loudspeaker, e.g., as illustrated in FIG. 1C. In embodiments, indicia of the voltage sense data and current sense data may be received. The impedance estimator is configured to receive frequency domain signals representative of the voltage sense data and the current sense data respectively, and to estimate the impedance of the loudspeaker according to Equations 1 & 2 described above. The resulting impedance estimate Z(s), voltage U(s) divided by current I(s), may include one or more impedance components as also described above: resistivity 'R,' inductance 'Ls', primary resonance, and/or secondary resonance. Each of these components may include one or more associated parameters. Based on the estimated impedance Z(s), the impedance estimator is configured to estimate the impedance components and the associated parameters for the impedance components.

As shown in the Laplace domain, the transform of the voltage U(s) may be represented as a sum of the transform of the resistivity multiplied by the transform of the current I(s), the inductance multiplied by the transform of the current I(s) and 's', and a transform of the cone excursion 'X(s)' multiplied by 's' that is modified by $\phi$ (i.e., a force factor, power factor, or induction factor of the loudspeaker, hereinafter "force factor"), as shown below in Equation 3. The differential equation related to electrical side of the loudspeaker, governing the behavior, is:

$$U(s) = RI(s) + LsI(s) + \phi sX(s). \quad \text{(Eq. 3)}$$

This can combined with an observed electrical impedance:

$$Z(s) = Z_1(s) + Z_2(s) + Z_3(s) + Z_6(s), \quad \text{(Eq. 4)}$$

with the impedance components, comprising one or more impedance parameters, being:

$Z_1(s) = R$ (voice coil resistivity), $Z_2(s) = Ls$ (voice coil inductance), $Z_3(s) = \dfrac{s\phi^2}{ms^2 + rs + \dfrac{1}{c}}$ (primary resonance(mechanical)), and $Z_6(s) = \dfrac{s}{C_6 s^2 + \dfrac{1}{R_6}s + \dfrac{1}{L_6}}$ (secondary resonance), to form the voice coil voltage to cone excursion that takes the secondary resonance in the impedance into account, where for $Z_3(s)$, the parameter 'm' is the mass of the moving loudspeaker system, the parameter 'r' is the mechanical resistance of the loudspeaker driver suspension, and the parameter 'c' is the compliance of driver suspension (1/k or 1/mechanical-stiffness), and for the electrical equivalent of $Z_6(s)$, capacitor '$C_6$', resistor '$R_6$', and inductor '$L_6$', in parallel as lumped parameters, are:

$$C_6 = m_2/\phi_2^2, \ R_6 = \phi_2^2/r_2, \text{ and } L_6 = c_2\phi_2^2 = \phi_2^2/k_2.$$

The parameters of $Z_6(s)$, the secondary resonance component, may be denoted with a subscript of '2' for clarity and naming convention purposes.

The voice coil voltage to cone excursion transform may be represented as:

$$U(s) = (Z_1(s) + Z_2(s))\dfrac{U(s)}{Z(s)} + \phi sX(s) \Leftrightarrow U(s)\left(1 - \dfrac{Z_1(s) + Z_2(s)}{Z(s)}\right) = \quad \text{(Eq. 5)}$$

-continued
$$\phi sX(s) \Leftrightarrow \dfrac{X(s)}{U(s)} = \dfrac{1}{\phi s}\dfrac{Z_3(s) + Z_6(s)}{Z_1(s) + Z_2(s) + Z_3(s) + Z_6(s)}.$$

The secondary resonance may be a result of the specific acoustic design of a loudspeaker enclosure with acoustic radiation through a narrowing "port". It should be noted that if consideration to the secondary resonance is desirable, then the term representing it can likely be fixed as it reflects physical dimensions of the enclosure which are not subject to change due to manufacturing variations, temperature, or other environmental factors.

The voice coil resistivity R provides the general level of the impedance and dominates the impedance at low frequencies $Z_{LF}$. Hence, the resistivity R can be found as the impedance at low frequencies by:

$$|Z_{LF}(\omega)| = R, \quad \text{(Eq. 6)}$$

The voice coil inductance Ls results in an upward linear slope of the impedance estimate, dominating the overall impedance at higher frequencies $Z_{HF}$. As can be seen from the expression of $Z_2(s)$, the value of the inductance is equal to the slope. Disregarding eddy currents and using a simplified voice coil inductance model, at higher frequencies the magnitude of the impedance is dominated by:

$$|Z_{HF}(\omega)| = |R + j\omega L|, \quad \text{(Eq. 7)}$$

where R is a non-negligible contribution when the voice coil inductance Ls is small. Using a sum of squared error of squared magnitude of impedance over a frequency range for the cost function, the derivate with respect to the voice coil inductance Ls and resistivity R is derived to:

$$L = \sqrt{\dfrac{\sum\limits_{\omega}(|Z(\omega)|^2 - R^2)\omega^2}{\sum\limits_{\omega}\omega^4}}, \quad \text{(Eq. 8)}$$

for voice coil inductance calculated from the first non-trivial solution, or for a joint optimal solution:

$$L = \sqrt{\dfrac{\left(\sum\limits_{\omega}|Z(\omega)|^2\omega^2\right)\left(\sum\limits_{\omega}1\right) - \left(\sum\limits_{\omega}\omega^2\right)\left(\sum\limits_{\omega}|Z(\omega)|^2\right)}{\left(\sum\limits_{\omega}\omega^4\right)\left(\sum\limits_{\omega}1\right) - \left(\sum\limits_{\omega}\omega^2\right)^2}}, \quad \text{(Eq. 9)}$$

and $$R = \sqrt{\dfrac{\sum\limits_{\omega}|Z(\omega)|^2 - L^2\sum\limits_{\omega}\omega^2}{\sum\limits_{\omega}1}}. \quad \text{(Eq. 10)}$$

The mechanical primary resonance impedance component ($Z_3(s)$ as in the description of Equation 4) is responsible for the primary resonance appearing at lower frequencies of the impedance estimate. The impedance of loudspeaker and enclosure designs for smartphones and other smaller handheld devices typically have their primary resonance in lower frequency ranges (e.g., at or around 1 kHz). Primary resonance impedance component $Z_3(s)$ has a resonance frequency where the square of the magnitude of the numerator has a minimum. The magnitude of the numerator is given by:

$$\frac{1}{|Z_3(s=j\omega)|^2} = \left|\frac{m}{\phi^2}j\omega + \frac{r}{\phi^2} + \frac{1}{\phi^2 cj\omega}\right|^2 = \quad \text{(Eq. 11)}$$

$$\left|\frac{m}{\phi^2}j\omega + \frac{r}{\phi^2} - \frac{1}{\phi^2 c\omega}j\right|^2 = \left(\frac{m}{\phi^2}\omega - \frac{1}{\phi^2 c\omega}\right)^2 + \left(\frac{r}{\phi^2}\right)^2,$$

which, through the derivative with respect to frequency, yields the primary resonance frequency at:

$$\omega_s = \frac{1}{\sqrt{mc}}. \quad \text{(Eq. 12)}$$

Although the primary resonance frequency may be determined by $Z_3(s)$ alone, the absolute impedance at the resonance frequency is determined by $Z_1(s)+Z_3(s)$, assuming that the contribution of the inductance and a possible secondary resonance is negligible at low frequency.

$$Z_s = \left|Z_1\left(s=j\frac{1}{\sqrt{mc}}\right) + Z_3\left(s=j\frac{1}{\sqrt{mc}}\right)\right| = \quad \text{(eq. 13)}$$

$$\left|R + \frac{1}{j\frac{m}{\phi^2}\frac{1}{\sqrt{mc}} + \frac{r}{\phi^2} - j\frac{\sqrt{mc}}{\phi^2 c}}\right| = R + \frac{\phi^2}{r}.$$

The two frequencies where the impedance has decreased from its primary resonance value given above to:

$$Z_M = |Z_1(\omega_{L/H}) + Z_3(\omega_{L/H})| = \sqrt{RZ_s}. \quad \text{(Eq. 14)}$$

are denoted $\omega_L$ and $\omega_H$, respectively, and determined from:

$$|Z_1(\omega) + Z_3(\omega)| = \left|R + \frac{1}{j\frac{m}{\phi^2}\omega + \frac{r}{\phi^2} - j\frac{1}{\phi^2 c\omega}}\right| = \quad \text{(Eq. 15)}$$

$$\left|R + \frac{1}{\frac{1}{Z_s - R} + j\left(\frac{m}{\phi^2}\omega - \frac{1}{\phi^2 c\omega}\right)}\right| =$$

$$\sqrt{\frac{(\phi^2 c\omega Z_s)^2 + (Z_s - R)^2 R^2\left(\left(\frac{\omega}{\omega_s}\right)^2 - 1\right)^2}{(\phi^2 c\omega)^2 + (Z_s - R)^2\left(\left(\frac{\omega}{\omega_s}\right)^2 - 1\right)^2}}.$$

Inserting $\omega_L$ and $\omega_H$ and imposing the constraint leads to the following two equations:

$$\frac{(\phi^2 c\omega_L Z_s)^2 + (Z_s - R)^2 R^2\left(\left(\frac{\omega_L}{\omega_s}\right)^2 - 1\right)^2}{(\phi^2 c\omega_L)^2 + (Z_s - R)^2\left(\left(\frac{\omega_L}{\omega_s}\right)^2 - 1\right)^2} = RZ_s. \quad \text{(Eq. 16)}$$

$$\frac{(\phi^2 c\omega_H Z_s)^2 + (Z_s - R)^2 R^2\left(\left(\frac{\omega_H}{\omega_s}\right)^2 - 1\right)^2}{(\phi^2 c\omega_H)^2 + (Z_s - R)^2\left(\left(\frac{\omega_H}{\omega_s}\right)^2 - 1\right)^2} = RZ_s. \quad \text{(Eq. 17)}$$

Based on these known parameters and the two equations above, it appears that the force-factor and the effective compliance of the driver suspension can be calculated from:

$$\phi^2 c = |Z_s - R|\frac{1}{\omega_s^2}\left|\omega_L - \frac{\omega_s^2}{\omega_L}\right|\sqrt{\frac{(RZ_s - R^2)}{(Z_s^2 - RZ_s)}} = \quad \text{(Eq. 18)}$$

$$|Z_s - R|\frac{1}{\omega_s^2}\left|\omega_L - \frac{\omega_s^2}{\omega_L}\right|\sqrt{\frac{R}{Z_s}},$$

and $$\phi^2 c = |Z_s - R|\frac{1}{\omega_s^2}\left|\omega_H - \frac{\omega_s^2}{\omega_H}\right|\sqrt{\frac{(RZ_s - R^2)}{(Z_s^2 - RZ_s)}} = \quad \text{(Eq. 19)}$$

$$|Z_s - R|\frac{1}{\omega_s^2}\left|\omega_H - \frac{\omega_s^2}{\omega_H}\right|\sqrt{\frac{R}{Z_s}}.$$

However, since $\omega_s = \sqrt{\omega_L \omega_H}$ the two right-hand sides become identical:

$$\left|\omega_H - \frac{\omega_s^2}{\omega_H}\right| = \left|\frac{\omega_s^2}{\omega_L} - \frac{\omega_L \omega_s^2}{\omega_s^2}\right| = \left|-\left(\omega_L - \frac{\omega_s^2}{\omega_L}\right)\right| = \left|\left(\omega_L - \frac{\omega_s^2}{\omega_L}\right)\right| q.e.d. \quad \text{(Eq. 20)}$$

Intuitively, this also makes sense, as ($\phi^2 c$) cannot take on two different results.

If the (equivalent) mass is known then the parameters can be calculated according to:

$$c = \frac{1}{\omega_s^2 m}, \phi^2 = m|Z_s - R|\left|\omega_H - \frac{\omega_s^2}{\omega_H}\right|\sqrt{\frac{R}{Z_s}}, \text{ and}$$

$$r = \frac{\phi^2}{Z_s - R} = m\left|\omega_H - \frac{\omega_s^2}{\omega_H}\right|\sqrt{\frac{R}{Z_s}}.$$

Fittings, as described herein, may be based on separately- or jointly-estimated resistivity and induction. As should be expected, the mass can be set arbitrarily, resulting in identical model impedance. It should be noted that these are lumped parameters (given the set mass) as opposed to actual physical loudspeaker parameters as the moving mass, the volume of enclosure, and the diaphragm area are unknown, and hence, cannot be backed out of the lumped parameters to get the physical loudspeaker parameters. However, this is not important to the present application where the lumped parameters (given the set mass) are sufficient to model the impedance. In other words, if the mass is set differently, then the estimated lumped loudspeaker parameters change, and leave the resulting model of the impedance unchanged.

However, this is not the case for the voice coil voltage to cone excursion transfer function which is given above as $$\frac{X(s)}{U(s)}$$

in Equation 5. If the impedances remain unchanged, but the force factor $\phi$ changes, then the excursion transfer function also changes. Hence, an estimate of the actual mass may be needed in some embodiments in order to render the excursion transfer function uniquely determined.

The issue of an under-determined system, in the sense of estimating the core four loudspeaker parameters from the primary resonance of the impedance, is also evident from the expression of the sub-impedance:

$$Z_3(s) = \cfrac{1}{\frac{m}{\phi^2}s + \frac{r}{\phi^2} + \frac{1}{\phi^2 cs}}. \qquad \text{(Eq. 21)}$$

The three independent parameters determining the sub-impedance are:

$$\frac{m}{\phi^2}, \frac{r}{\phi^2},$$

and $\phi^2 c$.

From these three independent lumped parameters, it is not possible to calculate the four core loudspeaker parameters $\phi^2$, m, r, c. The three independent lumped parameters above uniquely determine the impedance, but as also noted above, the four core loudspeaker parameters are required to determine the voice coil voltage to cone excursion transfer function, which is needed in order to predict the cone movement as part of the loudspeaker protection, in embodiments. Hence, either one of the core loudspeaker parameters must be known, e.g., from the manufacturer, and reasonably assumed fixed, or an additional measurement may be required, facilitating the break-down of the three lumped parameters into the four core parameters. Consequently, it is sensible to specify the sub-component responsible of the primary resonance of the impedance in terms of the lumped parameters, and in terms of traditional lumped parameters as used for the secondary resonance component $Z_6(s)$ the sub-impedance is specified as $$Z_3(s) = \cfrac{s}{C_3 s^2 + \frac{1}{R_3}s + \frac{1}{L_3}}, \qquad \text{(Eq. 22)}$$

where $$C_3 = \frac{m}{\phi^2}$$

(electrical capacitance representing mechanical mass), $$R_3 = \frac{\phi^2}{r}$$

(resistance due to mechanical losses), and
$L_3 = \phi^2 c$ (electrical inductance representing mechanical compliance).

In terms of estimating the lumped parameters directly from the parameters for resistivity R, resonance frequency $\omega_s$, impedance at resonance frequency $Z_s$, the low frequency corresponding to geometric mean impedance $\omega_L$, and the high frequency corresponding to geometric mean impedance $\omega_H$, estimated from the measured impedance, the simplified solutions below in Equations and parameters described for the secondary resonance component apply directly as the voice coil inductance is negligible at the frequency of the primary resonance. Note that the compliance, c, is a lumped parameter also including the effect of an enclosure, in embodiments:

$$R_3 = Z_S - R,$$

$$L_3 = \frac{1}{\omega_L}|Z_S - R|\left|\left(\frac{\omega_L}{\omega_S}\right)^2 - 1\right|\sqrt{\frac{R}{Z_S}}, \text{ and}$$

$$C_3 = \frac{1}{\omega_S^2 L_3}.$$

Beyond the lumped parameters, the force-factor $\phi$ may be specifically estimated in embodiments to uniquely determine the voice coil voltage to cone excursion transfer function. Estimating, or knowing, any one of the four core loudspeaker parameters will allow unique identification of the force-factor, and consequently, the excursion transfer function. A consideration to manufacturing, aging, and/or environmentally induced changes to the parameters may be used in embodiments for determining if any one parameter can be considered fixed, and if it is known or easily measurable.

In embodiments, the nominal force-factor specified by the manufacturer of the loudspeaker may be used. If it is associated with a tolerance, $\alpha_\phi$:

$$\phi = (1 \pm \alpha_\phi)\phi_{nom}. \qquad \text{(Eq. 23)}$$

As can be seen from the transfer function in Equation 5 above, it is straightforward to incorporate this tolerance into the maximum excursion by lowering it with a corresponding factor, i.e.:

$$x_{max} = (1 - \alpha_\phi)x_{max_{nom}}. \qquad \text{(Eq. 24)}$$

In embodiments, the lower end force-factor may be used as:

$$\phi = (1 - \alpha_\phi)\phi_{nom}, \qquad \text{(Eq. 25)}$$

to obtain the worst case possible excursion, and leave the maximum excursion, $x_{max}$, as specified by the manufacturer $x_{max} = x_{max_{nom}}$. Either case assumes that only manufacturing variance affects the force-factor $\phi$, i.e., that no change due to aging, temperature, or other environmental factor, although such considerations may be taken into account in embodiments.

In embodiments, the primary resonance and its parameters $\omega_s$, $Z_s$, $\omega_L$, and $\omega_H$ may be identified from a measured impedance by focusing on the 500 Hz to 2000 Hz frequency range, which is a typical range for a primary resonance of a microspeaker and enclosure for some devices such as mobile and smart phones.

The secondary resonance impedance component ($Z_6(s)$ as in the description of Equation 4), is responsible for the secondary resonance appearing between lower frequencies and mid-ranges frequencies of the impedance estimate, e.g., at and/or around approximately 4 kHz. Equivalent to Equation 12 above with respect to the primary resonance, the resonance frequency is given by:

$$\omega_S = \frac{1}{\sqrt{C_6 L_6}}. \qquad \text{(Eq. 26)}$$

However, while magnitude of the impedance at the primary resonance is largely determined by $Z_1(s) + Z_3(s)$, at the secondary resonance the inductance may start to take on a non-negligible size in some embodiments. Hence, at the secondary resonance, the inductance may need to be taken into consideration when finding the impedance at the resonance frequency.

$$R_6 = \sqrt{Z_s^2 - (\omega_s L)^2} - R, \text{ and} \qquad \text{(Eq. 27)}$$

$$(R + R_6)^2 = Z_s^2 - (\omega_s L)^2. \qquad \text{(Eq. 28)}$$

Likewise, as similarly described above for the primary resonance, the two frequencies where the impedance has decreased from its secondary resonance value given above to:

$$Z_M = |Z_1(\omega_{L/H}) + Z_2(\omega_{L/H}) + Z_6(\omega_{L/H})| = \sqrt{RZ_s}, \quad \text{(Eq. 29)}$$

are denoted $\omega_L$ and $\omega_H$, respectively, and determined from:

$$|Z_1(\omega) + Z_2(\omega) + Z_6(\omega)| = \left| R + j\omega L + \frac{1}{j\omega C_6 + \frac{1}{R_6} - j\frac{1}{L_6\omega}} \right| = \quad \text{(Eq. 30)}$$

$$\left| R + j\omega L + \frac{1}{\frac{1}{R_6} + j\left(\omega C_6 - \frac{1}{L_6\omega}\right)} \right| = \left| R + j\omega L + \frac{1}{\frac{1}{R_6} + j\frac{1}{L_6\omega}\left(\left(\frac{\omega}{\omega_s}\right)^2 - 1\right)} \right| =$$

$$\left| \frac{\omega\left(L_6(R_6 + R) - LR_6\left(\left(\frac{\omega}{\omega_s}\right)^2 - 1\right)\right) + j\left(\omega^2 LL_6 + RR_6\left(\left(\frac{\omega}{\omega_s}\right)^2 - 1\right)\right)}{L_6\omega + jR_6\left(\left(\frac{\omega}{\omega_s}\right)^2 - 1\right)} \right| \Rightarrow,$$

and $$|Z_1(\omega) + Z_2(\omega) + Z_6(\omega)|^2 = \frac{\omega^2\left(L_6(R_6 + R) - LR_6\left(\left(\frac{\omega}{\omega_s}\right)^2 - 1\right)\right)^2 + \left(\omega^2 LL_6 + RR_6\left(\left(\frac{\omega}{\omega_s}\right)^2 - 1\right)\right)^2}{(L_6\omega)^2 + R_6^2\left(\left(\frac{\omega}{\omega_s}\right)^2 - 1\right)^2} = \quad \text{(Eq. 31)}$$

$$\frac{\left(\left(\frac{\omega}{\omega_s}\right)^2 - 1\right)^2((\omega LR_6)^2 + (RR_6)^2) + (\omega^2 LL_6)^2 + \omega^2(L_6(R_6 + R))^2 - 2\omega^2 L_6 LR_6^2\left(\left(\frac{\omega}{\omega_s}\right)^2 - 1\right)}{(L_6\omega)^2 + R_6^2\left(\left(\frac{\omega}{\omega_s}\right)^2 - 1\right)^2} =$$

$$\frac{L_6^2\left((\omega^2 L)^2 + \omega^2(R_6 + R)^2\right) - 2\omega^2 L_6 LR_6^2\left(\left(\frac{\omega}{\omega_s}\right)^2 - 1\right) + ((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2} =$$

$$\frac{\omega^2 L_6\left(L_6(\omega L)^2 + L_6(R_6 + R)^2 - 2LR_6^2\left(\left(\frac{\omega}{\omega_s}\right)^2 - 1\right)\right) + ((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2}.$$

For embodiments where the inductance of the voice coil is negligible, Equation 31 simplifies to:

$$|Z_1(\omega) + Z_2(\omega) + Z_6(\omega)|^2 \approx |Z_1(\omega) + Z_6(\omega)|^2 = \quad \text{(Eq. 32)}$$

$$\frac{\omega^2(L_6(R_6 + R))^2 + (RR_6)^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2} =$$

$$\frac{L_6^2(\omega(R_6 + R))^2 + (RR_6)^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2},$$

and at the lower geometric mean frequency, this equals:

$$Z_M^2 = |Z_1(\omega_L) + Z_6(\omega_L)|^2 = \quad \text{(Eq. 33)}$$

$$\frac{L_6^2(\omega_L(R_6 + R))^2 + (RR_6)^2\left(\left(\frac{\omega_L}{\omega_s}\right)^2 - 1\right)^2}{(L_6\omega)^2 + R_6^2\left(\left(\frac{\omega}{\omega_s}\right)^2 - 1\right)^2} = RZ_S \Leftrightarrow$$

$$L_6^2 \omega_L^2((R_6 + R)^2 - RZ_S) = RR_6^2(Z_S - R)\left(\left(\frac{\omega_L}{\omega_s}\right)^2 - 1\right)^2$$

$$L_6^2 \omega_L^2 Z_S(Z_S - R) = R(Z_S - R)^3\left(\left(\frac{\omega_L}{\omega_s}\right)^2 - 1\right)^2 \Leftrightarrow$$

$$L_6^2 = \frac{R}{Z_S}\frac{1}{\omega_L^2}(Z_S - R)^2\left(\left(\frac{\omega_L}{\omega_s}\right)^2 - 1\right)^2 \Rightarrow$$

$$L_6 = \frac{1}{\omega_L}|Z_S - R|\left|\left(\frac{\omega_L}{\omega_s}\right)^2 - 1\right|\sqrt{\frac{R}{Z_S}}.$$

Accordingly, in embodiments, if the impedance of the voice coil inductance is negligible at the secondary resonance, then the three parameters responsible for the secondary resonance can be found from the measured properties ($\omega_s$, $Z_s$, and $\omega_L$) of the secondary resonance as:

$$R_6 = Z_S - R, \quad L_6 = \frac{1}{\omega_L}|Z_S - R|\left|\left(\frac{\omega_L}{\omega_s}\right)^2 - 1\right|\sqrt{\frac{R}{Z_S}}, \text{ and } C_6 = \frac{1}{\omega_s^2 L_6}.$$

Impedance model fitter 202 is configured to fit the impedance components described above that are based on the voltage sense data and the current sense data used to estimate the impedance, including parameters thereof in embodiments, to generate an estimated impedance model using fitting components, e.g., a fit resistivity component, a fit inductance component, a fit primary resonance component, and a fit secondary resonance component. Each of these fitting components may receive its respective impedance estimation portion from the impedance estimator, in embodiments, while in other embodiments the entire impedance estimate may be provided and each fitting component may extract its appropriate impedance components and/or parameters. It should be noted, however, that in embodiments, any number of components and/or parameters may be estimated and/or fitted. It is also contemplated herein that in some embodiments, the fitting components may be included together as a single fitting component.

voltage to cone excursion transfer function given by Equation 5 which is reproduced here:

$$\frac{X(s)}{U(s)} = \frac{1}{\phi s} \frac{Z_3(s) + Z_6(s)}{Z_1(s) + Z_2(s) + Z_3(s) + Z_6(s)}. \quad \text{(Eq. 5)}$$

In embodiments where all components of the fitted, estimated impedance model are present and utilized (i.e., resistivity, inductance, primary resonance, and secondary resonance), the excursion transfer function becomes:

$$\frac{X(s)}{U(s)} = \frac{1}{\phi s} \frac{\dfrac{s}{C_3 s^2 + \dfrac{1}{R_3} s + \dfrac{1}{L_3}} + \dfrac{s}{C_6 s^2 + \dfrac{1}{R_6} s + \dfrac{1}{L_6}}}{R + sL + \dfrac{s}{C_3 s^2 + \dfrac{1}{R_3} s + \dfrac{1}{L_3}} + \dfrac{s}{C_6 s^2 + \dfrac{1}{R_6} s + \dfrac{1}{L_6}}}, \quad \text{(Eq. 34)}$$

$$= \frac{1}{\phi s} \frac{\dfrac{sL_3 R_3}{L_3 R_3 C_3 s^2 + L_3 s + R_3} + \dfrac{sL_6 R_6}{L_6 R_6 C_6 s^2 + L_6 s + R_6}}{R + sL + \dfrac{sL_3 R_3}{L_3 R_3 C_3 s^2 + L_3 s + R_3} + \dfrac{sL_6 R_6}{L_6 R_6 C_6 s^2 + L_6 s + R_6}}$$

$$= \frac{1}{\phi} \frac{L_3 R_3 (L_6 R_6 C_6 s^2 + L_6 s + R_6) + L_6 R_6 (L_3 R_3 C_3 s^2 + L_3 s + R_3)}{((R + sL)(L_3 R_3 C_3 s^2 + L_3 s + R_3)(L_6 R_6 C_6 s^2 + L_6 s + R_6) + sL_3 R_3 (L_6 R_6 C_6 s^2 + L_6 s + R_6) \ldots + sL_6 R_6 (L_3 R_3 C_3 s^2 + L_3 s + R_3))}$$

$$= \frac{b_{S,0} s^2 + b_{S,1} s + b_{S,2}}{a_{S,0} s^5 + a_{S,1} s^4 + a_{S,2} s^3 + a_{S,3} s^2 + a_{S,4} s + a_{S,5}}, \quad \text{(Eq. 35)}$$

where $b_{s,0} = \dfrac{1}{\phi} L_3 R_3 L_6 R_6 (C_3 + C_6)$, $b_{s,1} = \dfrac{1}{\phi} L_3 L_6 (R_3 + R_6)$, $b_{s,2} = \dfrac{1}{\phi} R_3 R_6 (L_3 + L_6)$, $a_{s,0} = L L_3 R_3 C_3 L_6 R_6 C_6$, $a_{s,1} = L L_3 R_3 C_3 L_6 + L L_3 L_6 R_6 C_6 + R L_3 R_3 C_3 L_6 R_6 C_6$, $a_{s,2} = L L_3 R_3 C_3 R_6 + L L_3 L_6 + L R_3 L_6 R_6 C_6 + R L_3 R_3 C_3 L_6 + R L_3 L_6 R_6 C_6 + L_3 R_3 L_6 R_6 C_6 + L_6 R_6 L_3 R_3 C_3$, $a_{s,3} = L L_3 R_6 + L R_3 L_6 + R L_3 R_3 C_3 R_6 + R R_3 L_6 R_6 C_6 + L_3 R_3 L_6 + L_6 R_6 L_3$, $a_{s,4} = L R_3 R_6 + R L_3 R_6 + R R_3 L_6 + L_3 R_3 R_6 + L_6 R_6 R_3$, and $a_{s,5} = R R_3 R_6$.

Impedance to excursion model converter 204 of upstream loudspeaker model estimation component 200 of FIG. 2 may include a bi-linear transform component, and the fitted plurality of estimated impedance components fitted by the impedance model fitter, described above, are received by impedance to excursion model converter 204. In some embodiments, one or more of the fitted components may be provided to the bi-linear transform component. The bi-linear transform component is configured to transform a continuous time transfer function to discrete time to generate the loudspeaker excursion model, as described below. The excursion model corresponding to the impedance model of may be calculated from the expression of the voice coil The bi-linear transform component is configured to transform the continuous time transfer function to discrete time to generate the excursion model. The bi-linear transform, $$S = \frac{z-1}{z+1} \frac{2}{T}, \quad \text{(Eq. 36)}$$

is applied to the continuous time transfer function represented in Equations 5, 34, and 35, to find a corresponding discrete time transfer function:

$$\frac{X(z)}{U(z)} = \frac{b_{S,0}\left(\frac{z-12}{z+1T}\right)^2 + b_{S,1}\left(\frac{z-12}{z+1T}\right) + b_{S,2}}{a_{S,0}\left(\frac{z-12}{z+1T}\right)^5 + a_{S,1}\left(\frac{z-12}{z+1T}\right)^4 + a_{S,2}\left(\frac{z-12}{z+1T}\right)^3 + a_{S,3}\left(\frac{z-12}{z+1T}\right)^2 + a_{S,4}\left(\frac{z-12}{z+1T}\right) + a_{S,5}}$$

(Eq. 37)

$$= \frac{\left(\frac{T}{2}\right)^3 b_{S,0}(z-1)^2(z+1)^3 + \left(\frac{T}{2}\right)^4 b_{S,1}(z-1)(z+1)^4 + \left(\frac{T}{2}\right)^5 b_{S,2}(z+1)^5}{\left(a_{S,0}(z-1)^5 + \left(\frac{T}{2}\right)a_{S,1}(z-1)^4(z+1) + \left(\frac{T}{2}\right)^2 a_{S,2}(z-1)^3(z+1)^2 \ldots + \left(\frac{T}{2}\right)^3 a_{S,3}(z-1)^2(z+1)^3 + \left(\frac{T}{2}\right)^4 a_{S,4}(z-1)(z+1)^4 + \left(\frac{T}{2}\right)^5 a_{S,5}(z+1)^5\right)}$$

$$= \frac{(1+z^{-1})^3(b_0 + b_1 z^{-1} + b_2 z^{-2})}{1 + a_1 z^{-1} + a_2 z^{-2} + a_3 z^{-3} + a_4 z^{-4} + a_5 z^{-5}}, \text{ where}$$

(Eq. 38)

$$b_0 = \frac{\left(\frac{T}{2}\right)^3 b_{s,0} + \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$b_1 = \frac{-2\left(\frac{T}{2}\right)^3 b_{s,0} + 2\left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$b_2 = \frac{\left(\frac{T}{2}\right)^3 b_{s,0} - \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_1 = \frac{-5a_{s,0} - 3\left(\frac{T}{2}\right)a_{s,1} - \left(\frac{T}{2}\right)^2 a_{s,2} + \left(\frac{T}{2}\right)^3 a_{s,3} + 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_2 = \frac{10a_{s,0} + 2\left(\frac{T}{2}\right)a_{s,1} - 2\left(\frac{T}{2}\right)^2 a_{s,2} - 2\left(\frac{T}{2}\right)^3 a_{s,3} + 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_3 = \frac{-10a_{s,0} + 2\left(\frac{T}{2}\right)a_{s,1} + 2\left(\frac{T}{2}\right)^2 a_{s,2} - 2\left(\frac{T}{2}\right)^3 a_{s,3} - 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_4 = \frac{5a_{s,0} - 3\left(\frac{T}{2}\right)a_{s,1} + \left(\frac{T}{2}\right)^2 a_{s,2} + \left(\frac{T}{2}\right)^3 a_{s,3} - 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}, \text{ and}$$

$$a_5 = \frac{-a_{s,0} + \left(\frac{T}{2}\right)a_{s,1} - \left(\frac{T}{2}\right)^2 a_{s,2} + \left(\frac{T}{2}\right)^3 a_{s,3} - \left(\frac{T}{2}\right)^4 a_{s,4} + \left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}.$$

Given the embodiments described herein for which less than all of the impedance components of the estimated impedance model may be utilized or present in the model, e.g., as described above, it is contemplated in this disclosure that such estimated impedance models may be converted to excursion models using simplified transforms by the bi-linear transform component. That is, it in contemplated herein that in embodiments, one or more impedance components, such as inductance and/or secondary resonance may be negligible, absent, or not used. Further detail regarding such embodiments is provided U.S. Provisional Patent Application No. 62/415,026, entitled "System and Method for Loudspeaker Protection," filed on Oct. 31, 2016, the entirety of which is incorporated herein by reference.

Temperature predictor 206 is configured to receive a resistivity portion of the impedance model, as described above, via a connector 218, and to model or predict the temperature of the voice coil of the loudspeaker based thereon. In embodiments, a temperature model may be used to generate voice coil temperature prediction. That is, a voice coil temperature estimation/prediction 'T' may be based on resistivity variation with temperature. Temperature predictor 206 is configured to provide the temperature prediction to gain estimator 208 via a connector 220.

Gain estimator 208 is configured to receive the predicted voice coil temperature modeled by temperature predictor 206. Based on an estimated/predicted temperature T, and a specified $T_{max}$ of the voice coil (i.e., a maximum temperature above which continuous operation is not desired, as described herein), gain estimator 208 is configured to perform a heuristic method to calculate a full-band attenuation, $Gain_T$, of the audio signal, i.e., a gain change parameter. The gain change parameter may be an actual gain value, e.g., 0.8 when normal operational gain is 1.0, or may be a gain delta, e.g., 0.2 to achieve an effective gain of 0.8, according to embodiments. In such cases, the gain change parameter lowers the overall effective power of the audio signal, thus reducing the temperature of the voice coil. The gain change parameter may be 1.0, or a gain delta of 0.0, when it is not desired to lower the voice coil temperature, as described in further detail herein. In embodiments, a faster rate of increase for temperature T may result in the generation of a gain change parameter that reduces the overall effective gain more than a relatively slower rate of increase for temperature T. The gain change parameter may be provided to a temperature-constraining processing component, in embodiments. Gain estimator 208 may provide the gain change parameter to such temperature-constraining processing circuitry, e.g., of downstream audio signal processing component 102 of FIG. 1A via a connector 222.

IV. Example Downstream Processing Embodiments

As noted above, systems for protection of loudspeakers, such as microspeakers, along with their components such as downstream audio signal processing components, may be configured in various ways to provide loudspeaker protection.

In embodiments, by way of illustrative example and not limitation, a downstream audio signal processing component comprises one or more subcomponents configured to constrain the temperature of a loudspeaker (or voice coil thereof) during operation, constrain an excursion of the loudspeaker such as a predicted excursion of the diaphragm or cone corresponding to an audio signal, and suppress distortion of an audio signal to be played back by the loudspeaker. These functions of the downstream audio signal processing component may be based, at least in part, on temperature estimations/predictions, gain change parameters, and excursion models (and/or one or more parameters thereof), of the loudspeaker during its operation, as described herein.

Figure 4:
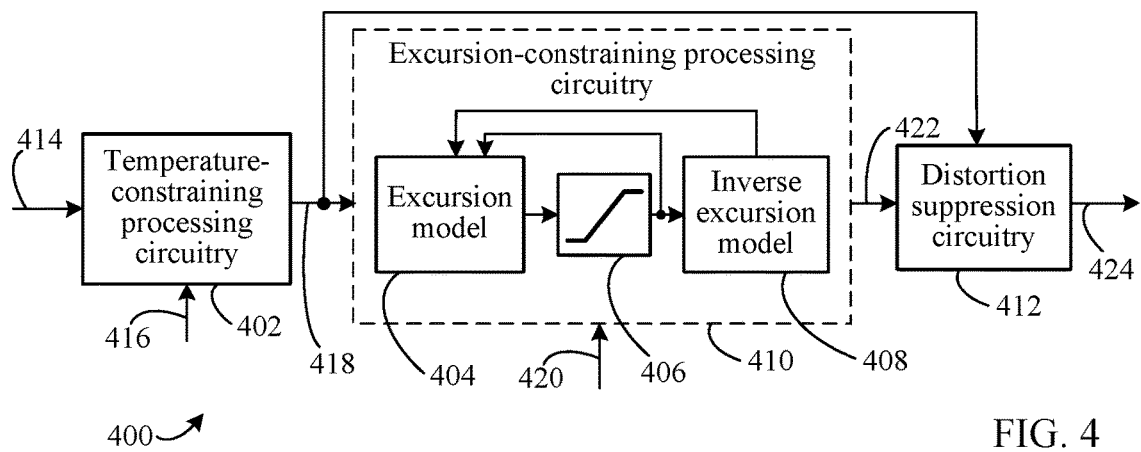
FIG. 4 shows a block diagram of a downstream audio signal processing component of a loudspeaker protection system, according to an example embodiment.

FIG. 4 shows a block diagram of a downstream audio signal processing component 400 of a loudspeaker protection system, according to an embodiment. Downstream audio signal processing component 400 may be a further embodiment of downstream audio signal processing component 102 of FIG. 1A. Downstream audio signal processing component 400 includes a temperature-constraining processing circuitry 402, excursion model circuitry 404, a limiter 406, inverse excursion model circuitry 408, and distortion suppression circuitry 412. In embodiments, excursion model circuitry 404, limiter 406, inverse excursion model circuitry 408 may together comprise excursion-constraining processing circuitry 410.

Figure 5:
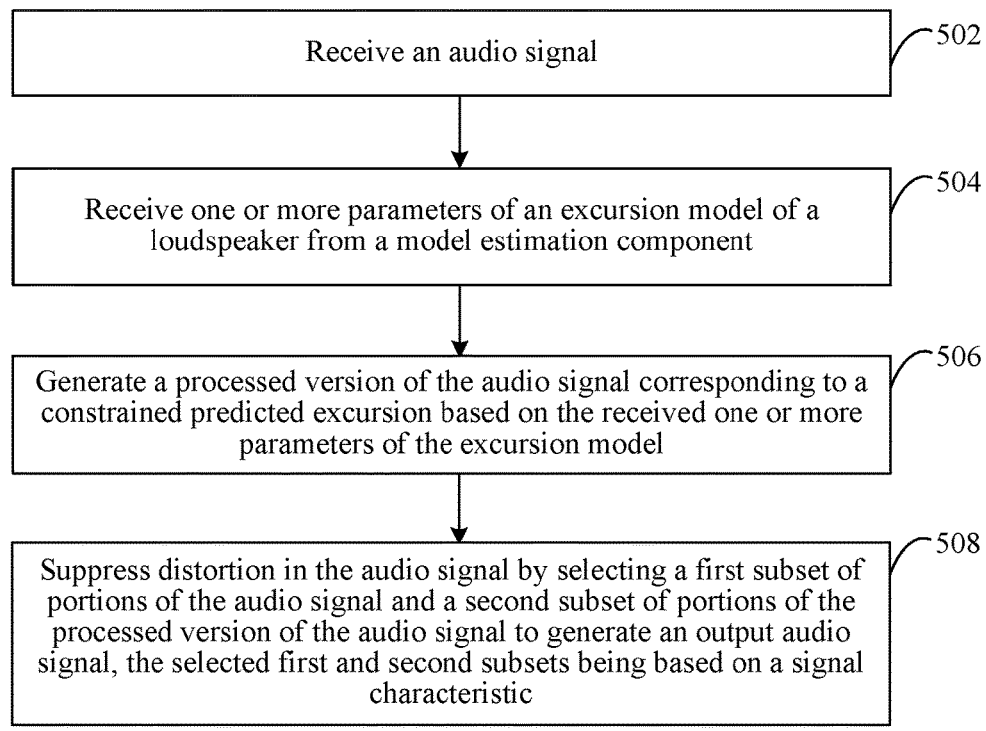
FIG. 5 shows a flowchart for distortion suppression by the downstream audio signal processing component of FIG. 4, according to an example embodiment.

Referring also to FIG. 5, a flowchart 500 for distortion suppression processing by distortion suppression circuitry 412 of FIG. 4 is shown, according to an embodiment. That is, temperature-constraining processing circuitry 402, excursion-constraining processing circuitry 410, and distortion suppression circuitry 412 of audio signal processing component 400, along with their respective subcomponents, may be configured to perform their respective functions in accordance with flowchart 500. Flowchart 500 is described as follows.

An audio signal is received (502), and an excursion model (and/or one or more parameters therefor) of the loudspeaker are received from a model estimation component (504). For example, in embodiments, constraining the loudspeaker voice coil temperature may be performed by downstream audio signal processing component 400 of FIG. 4. Temperature-constraining processing circuitry 402 is configured to receive an input audio signal via a connector 414. The input audio signal may be provided by a microphone, a processor, or a memory of a device (e.g., as recorded audio or the like), as described herein. In embodiments, the audio signal is received as a digital audio signal, although receiving analog audio signals is contemplated herein.

The input audio signal is processed according to the gain change parameter that is received from voice coil temperature modeler 210 to constrain the temperature of the voice coil in a temperature-constrained audio signal. For instance, temperature-constraining processing circuitry 402 is configured to process an input audio signal that is received via connector 414 according to the gain change parameter provided by a gain estimator (e.g., gain estimator 208 of upstream loudspeaker model estimation component 200 or via connector 416) to reduce the temperature of a loudspeaker or a voice coil thereof. In embodiments, the gain change parameter is applied to the input audio signal to lower the overall effective gain when the temperature of a loudspeaker or voice coil exceeds a determined value or is increasing toward the determined value, as described herein. When the temperature is decreasing, the constraint thereof may be relaxed, and temperature-constraining processing circuitry 402 may process the input audio signal on connector 414 using, e.g., a unity gain, or a gain that is higher than the gain change parameter used to constrain the input audio signal.

A temperature-constrained audio signal may be provided to first audio signal processing component as the audio signal described above. For example, temperature-constraining processing circuitry 402 is configured to provide the temperature-constrained audio signal to excursion-constraining processing circuitry 410 via connector 418. Embodiments further include providing the temperature-constrained audio signal via connector 418 to distortion suppression circuitry 412. In some embodiments, an input audio signal may be provided to distortion suppression circuitry 412 via connector 418 without processing by temperature-constraining processing circuitry 402 if temperature constraining is not included or is bypassed in some configurations. An input audio signal, or a temperature-constrained audio signal may be referred to herein as a pre-processed audio signal.

Excursion-constraining processing circuitry 410 also receives the audio signal (either as a temperature constrained audio signal from temperature-constraining processing circuitry 402 or as an input audio signal via connector 414), and an excursion model and/or one or more of its parameters from an upstream loudspeaker model estimation component (e.g., impedance to excursion model converter 204 of FIG. 4) via connector 420, in embodiments. Excursion-constraining processing circuitry 410 is configured to receive the excursion model or parameters thereof, e.g., at excursion model circuitry 404 and inverse excursion model circuitry 408, via connector 420, and receive the audio signal at excursion model circuitry 404 via connector 418. In embodiments, parameters of the excursion model may be provided to and received by excursion-constraining processing circuitry 410.

A processed version of the audio signal corresponding to a constrained predicted excursion is generated based on the received one or more parameters of the excursion model (506). A predicted diaphragm or cone excursion of the loudspeaker may be limited based on the excursion model by generating a processed version of the audio signal having a voltage corresponding to predicted excursion that has been constrained using one or more parameters of the excursion model. For example, excursion-constraining processing circuitry 410 is configured to limit a predicted excursion of a cone or diaphragm of a loudspeaker corresponding to an audio signal. In embodiments, excursion-constraining processing circuitry 410 is configured to limit a predicted excursion of a cone or diaphragm in a loudspeaker, such as diaphragm 122 loudspeaker 106 of FIG. 1A, according to a generated predicted excursion model described above and received via connector 420. Excursion-constraining processing circuitry 410 is also configured to limit a predicted excursion of a loudspeaker corresponding to an audio signal according to one or more parameters of the excursion model received via connector 420, according to embodiments. That is, according to embodiments, the excursion model or parameters thereof may be provided to feed-forward excursion model circuitry 404 and integral feed-backward inverse excursion model circuitry 408, and along with limiter 406 (together comprising a non-linear constraint filter), a predicted excursion of a loudspeaker is limited by generating a processed version of the audio signal having a voltage corresponding to the constrained predicted excursion.

Distortion in the audio signal is suppressed by selecting a first subset of portions of the audio signal and a second subset of portions of the processed version of the audio signal to generate an output audio signal, the selected first and second subsets being based on a signal characteristic (508). For instance, Distortion suppression circuitry 412 is configured to suppress distortion such as unwanted distortion in the processed version of the audio signal. Distortion in the processed version of the audio signal is suppressed as described in further detail below with respect to FIG. 6, thereby generating an output audio signal that may be played back by the loudspeaker. For instance, distortion suppression circuitry 412 may receive the processed version of the audio signal from excursion-constraining processing circuitry 410, via a connector 422, and suppress distortion, such as unwanted distortion, in the processed version of the audio signal. Distortion suppression circuitry 412 may also be configured to receive a temperature-constrained audio signal from temperature-constraining processing circuitry 402 via a connector 418, as described herein, for use in the distortion suppression. In some cases, the processed version of the audio signal may have distortion present due to the processing of the excursion-constraining processing circuitry 410 to constrain a predicted excursion of a loudspeaker corresponding to the audio signal.

According to embodiments, distortion suppression circuitry 412 is configured to suppress this distortion in the processed version of the audio signal based at least on an audio signal characteristic such as frequency domain energy associated with the processed version of the audio signal, e.g., with frequency resolution such as power- or magnitude-spectra although other types are contemplated herein, for example but without limitation, an audio signal voltage domain, a loudspeaker excursion domain, or an air pressure domain. It is also contemplated that other signal characteristics, e.g., without limitation, signal amplitude, and/or the like, in one or more signal domains may be used to determine the application of suppression as described herein.

Accordingly, distortion suppression circuitry 412 is configured to generate an audio signal output that may be saved and/or played back by the loudspeaker having suppressed distortion, e.g., a post-processed audio signal. The output audio signal may be provided for playback by the loudspeaker via a connector 424.

Figure 6:
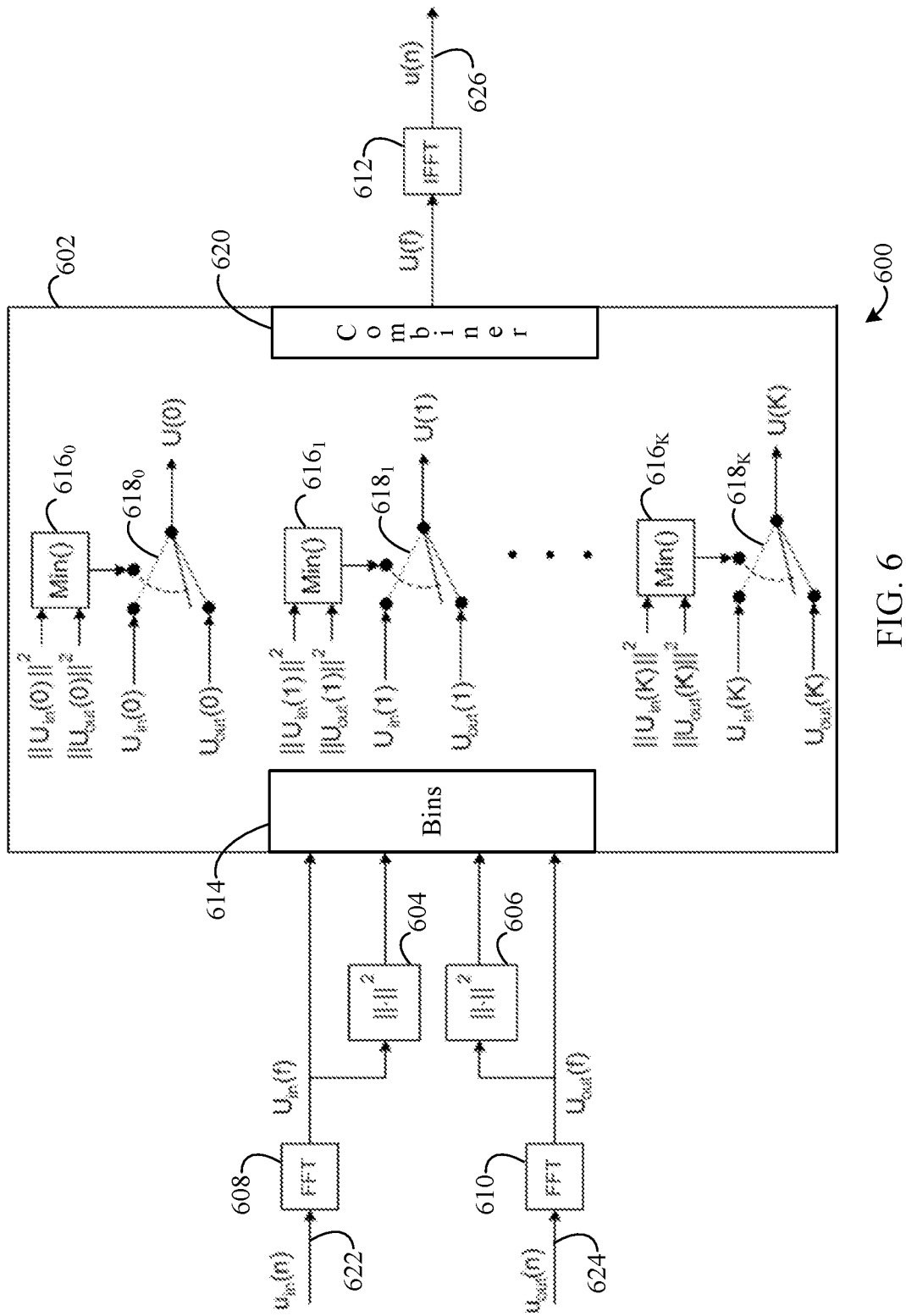
FIG. 6 shows a block diagram of suppression circuitry, according to an example embodiment.

Distortion suppression circuitry as described herein may be configured in various ways to suppress distortion in audio signals. For example, FIG. 6 shows a block diagram of a distortion suppression system 600, which may be part of a loudspeaker protection system, according to an embodiment. Distortion suppression system 600 may be a further embodiment of distortion suppression circuitry 412 of FIG. 4. Distortion suppression system 600 includes distortion suppression circuitry 602, a first value determination circuit 604, and a second value determination circuit 606. Distortion suppression circuitry 602 may include a bins circuit 614, a plurality of value comparison circuits $616_0$, $616_1$, . . . , and $616_K$, a plurality of signal selectors $618_0$, $618_1$, . . . , and $618_K$, and a combiner 620. Distortion suppression system 600 is configured to suppress this distortion in the processed version of the audio signal based at least on audio signal characteristics.

Figure 7:
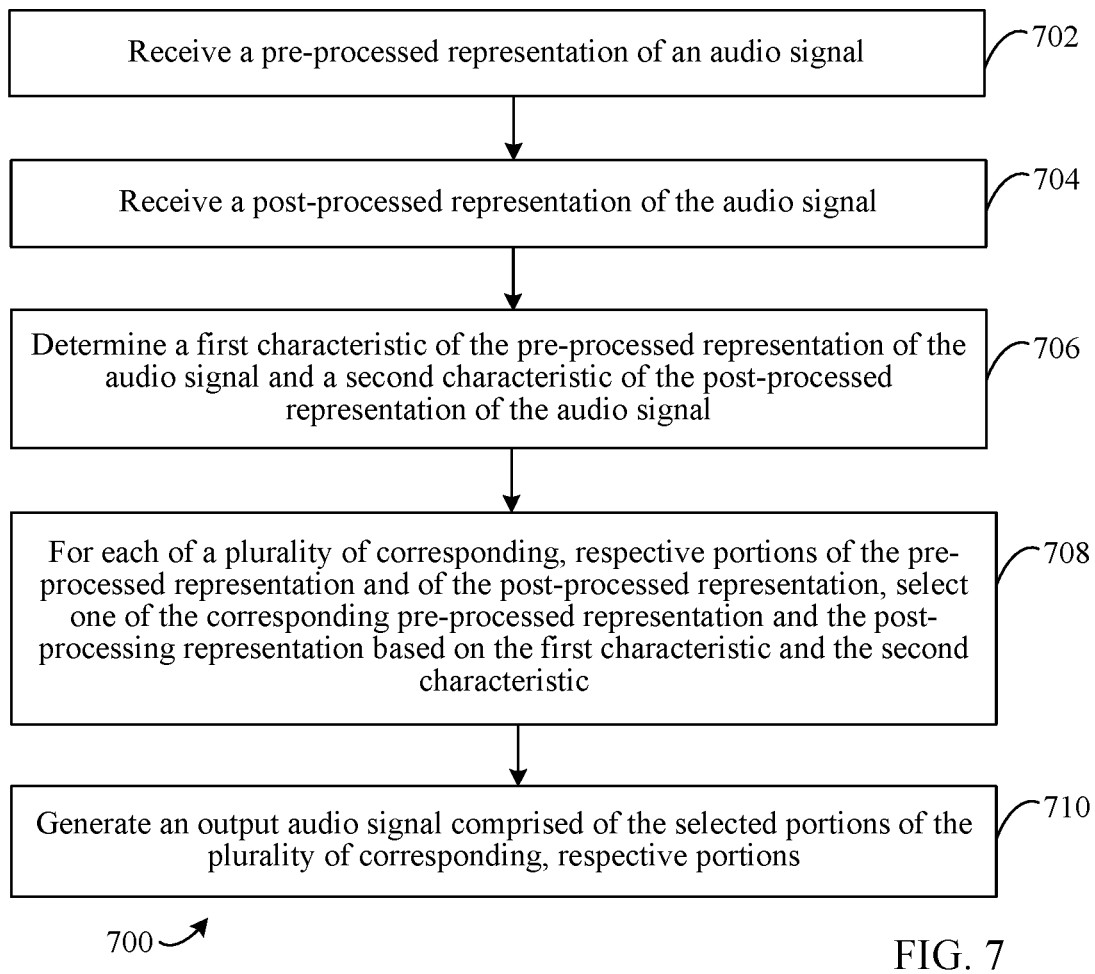
FIG. 7 shows a flowchart for distortion suppression by the distortion suppression circuitry of FIG. 6, according to an example embodiment.

Referring also to FIG. 7, a flowchart 700 for distortion suppression processing by distortion suppression system 600 of FIG. 6 is shown, according to an embodiment. That is, distortion suppression system 600, including distortion suppression circuitry 602, first value determination circuit 604, and second value determination circuit 606, along with their respective subcomponents, may be configured to perform their respective functions in accordance with flowchart 700. Flowchart 700 is described as follows.

A pre-processed representation of an audio signal is received (702), and a post-processed representation of the audio signal is received (704). For example, distortion suppression system 600 is configured to receive a post-processed audio signal "$u_{out}(n)$", e.g., a processed audio signal such as an audio signal corresponding to a constrained, predicted input into excursion-constraining processing circuitry as described herein, via a connector 624 (which corresponds to a portion of connector 418 of FIG. 4, in embodiments) and receive a pre-processed audio signal "$u_{in}(n)$", e.g., a pre-processed audio signal such as an audio signal prior to input into excursion-constraining processing circuitry as described herein, via a connector 622 (which corresponds to a portion of connector 418 of FIG. 4, in embodiments).

In embodiments, distortion suppression system 600 includes fast Fourier transform (FFT) circuits: FFT 608 and FFT 610; and an inverse FFT (IFFT) circuit: IFFT 612. In the embodiment illustrated in FIG. 6, distortion suppression circuitry 602 is configured to perform its distortion suppression functions with respect to frequency domain representations of the input audio signals $u_{out}(n)$ and $u_{in}(n)$. These audio signals may be transformed into respective frequency domain representations $U_{out}(f)$ by FFT 610 and $U_{in}(f)$ by FFT 608. The resulting, transformed frequency domain representations $U_{out}(f)$ and $U_{in}(f)$ may then be provided to second value determination circuit 606 and first value determination circuit 604, respectively, and to distortion suppression circuitry 602 as shown.

A first characteristic of the pre-processed representation of the audio signal and a second characteristic of the post-processed representation of the audio signal are determined (806). For instance, second value determination circuit 606 is configured to determine the second characteristic for post-processed signal representation $U_{out}(f)$, e.g., frequency-domain energy, and first value determination circuit 604 is configured to determine the first characteristic for pre-processed signal representation $U_{in}(f)$, e.g., frequency-domain energy. In some embodiments, one or more of first value determination circuit 604 and second value determination circuit 606 may be configured to determine at least one type of characteristic, as described herein.

For each of a plurality of corresponding, respective portions of the pre-processed representation and of the post-processed representation, one of the corresponding pre-processed representation and the post-processing representation is selected based on the first characteristic and the second characteristic (708). For example, distortion suppression circuitry 602 is configured to select portions of post-processed signal representation $U_{out}(f)$ and of pre-processed signal representation $U_{in}(f)$ based on a determination of a relationship between values of the first and second characteristics.

Figure 8:
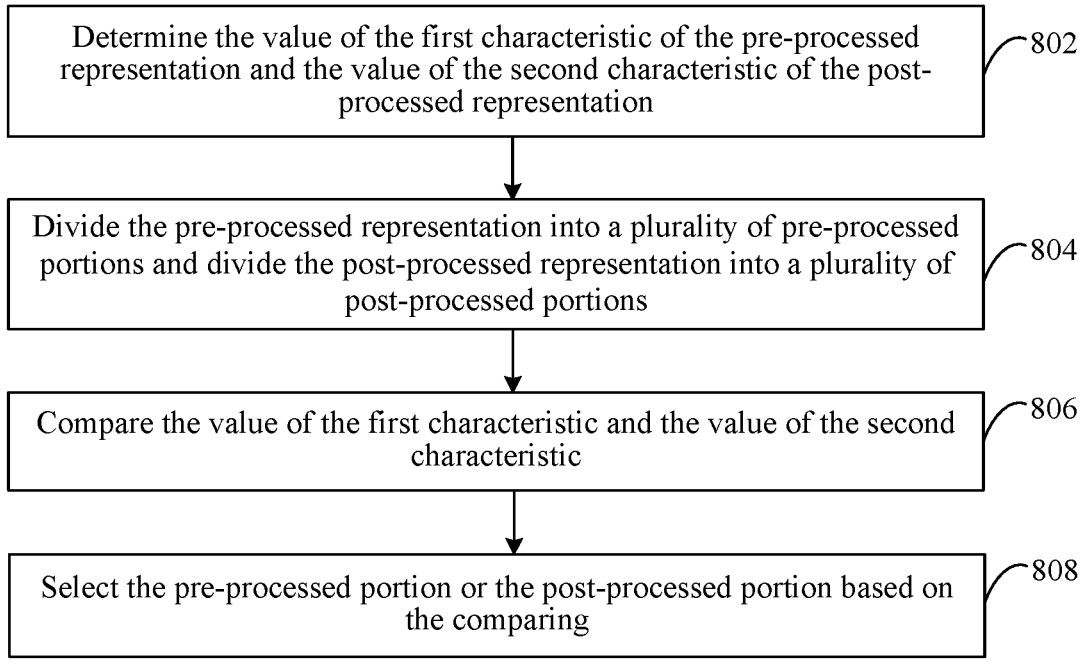
FIG. 8 shows a flowchart for distortion suppression by the distortion suppression circuitry of FIG. 6, according to an example embodiment.

Turning also to FIG. 8, a flowchart 800 for distortion suppression processing by distortion suppression system 600 of FIG. 6 is shown, according to an embodiment. That is, distortion suppression system 600 including distortion suppression circuitry 602, first value determination circuit 604, and second value determination circuit 606, along with their respective subcomponents, may be configured to perform their respective functions in accordance with flowchart 800. Flowchart 800 may be performed in conjunction with flowchart 700 of FIG. 7. Flowchart 800 is described as follows.

The value of the first characteristic of the pre-processed representation and the value of the second characteristic of the post-processed representation are determined (802). For example, distortion suppression circuitry 602, using second value determination circuit 606 and first value determination circuit 604 in embodiments, is configured to determine respective values of the second and first characteristics for the post-processed signal representation $U_{out}(f)$ and of pre-processed signal representation $U_{in}(f)$. In the illustrated embodiment, second value determination circuit 606 is configured to determine a value for frequency-domain energy (i.e., the second characteristic) for the post-processed signal representation $U_{out}(f)$, and first value determination circuit 604 is configured to determine a value for frequency-domain energy (i.e., the first characteristic) for the pre-processed signal representation $U_{in}(f)$.

The pre-processed representation is divided into a plurality of pre-processed portions and the post-processed representation is divided into a plurality of post-processed portions (804). For instance, also referring back to FIG. 6, bins circuit 614 of distortion suppression circuitry 602 is configured to divide received signals, such as $U_{in}(f)$ and $U_{out}(f)$ and/or representations thereof, as well as frequency domain signal energy representations from first value determination circuit 604 and second value determination circuit 606, into frequency bins (or bin-centers, or bin-centers centered within a range of frequencies). Bins circuit 614 may comprise sub-circuits (not shown for illustrative clarity) for one or more of its received signals $U_{in}(f)$ and $U_{out}(f)$ and/or representations thereof, as well as frequency domain signal energy representations from first value determination circuit 604 and second value determination circuit 606. In embodiments, the frequency bins may comprise 1024 or 2048 frequency bands for 44.1 kHz sampling, although variations are contemplated here as would be apparent of one of skill in the relevant art(s) having the benefit of this disclosure. Bins circuit 614 is configured to provide the signals corresponding to the divided frequency bins to value comparison circuits and signal selectors as described herein.

The value of the first characteristic and the value of the second characteristic are compared (806). For instance, as described above, distortion suppression circuitry 602 may include value comparison circuits $616_0, 616_1, \ldots,$ and $616_K$.

Each of value comparison circuits $616_0, 616_1, \ldots,$ and $616_K$ may be configured to receive a characteristic value (e.g., frequency-domain energy) corresponding to a specific bin, such as a frequency bin, for $U_{in}(f)$ (the first characteristic value) and to a specific bin for $U_{out}(f)$ the (second characteristic value), and/or representations thereof, from bins circuit 614. That is, according to embodiments 'k' may be a value greater than or equal to the number of bins for which bins circuit 614 divides its received signals. Value comparison circuits $616_0, 616_1, \ldots,$ and $616_K$ are each configured to compare their respective first and second characteristic values. In the illustrated embodiment, value comparison circuits $616_0, 616_1, \ldots,$ and $616_K$ are each configured to determine which of the characteristic values is lower according to a minimum determination function "Min( )" (e.g., which frequency bin has lower energy), although in embodiments alternate comparisons such as, but not limited to, a "Max( )" comparison are also contemplated. The determination performed by value comparison circuits $616_0, 616_1, \ldots,$ and $616_K$ are used to control corresponding plurality of signal selectors $618_0, 618_1, \ldots,$ and $618_K$, as shown.

The pre-processed portion or post-processed portion are selected (808). As described above, distortion suppression circuitry 602 may include signal selectors $618_0, 618_1, \ldots,$ and $618_K$. Each of signal selectors $618_0, 618_1, \ldots,$ and $618_K$ may be configured to select received bins from bins circuit 614. That is, according to embodiments 'k' may be a value greater than or equal to the number of bins for which bins circuit 614 divides its received signals. Signal selectors $618_0, 618_1, \ldots,$ and $618_K$ are each configured to select either a bin corresponding to $U_{in}(f)$ or a bin corresponding to $U_{out}(f)$ based on the determination made by a corresponding one of value comparison circuits $616_0, 616_1, \ldots,$ and $616_K$. Signal selectors $618_0, 618_1, \ldots,$ and $618_K$ may be any combination of discrete switches, switching circuits, combinatorial logic, and/or the like, configured to select an input of one or more inputs based on a control signal.

In embodiments, value comparison circuits $616_0, 616_1, \ldots,$ and $616_K$ may be configured to select predefined bins associated with signal representations, e.g., bins for either pre-processed or post-processed signals, when the characteristic values are equal, and/or may be configured to select bins for pre-processed signals when the pre-processed signal characteristic values are less than or equal to the post-processed signal characteristic values. Pre- and post-processed signals may also be selected based on the difference between the characteristic values as compared to a range delta described below.

Figure 9:
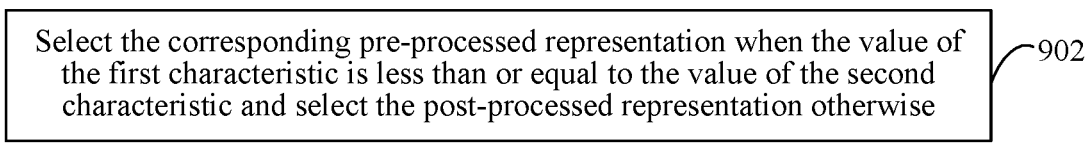
FIG. 9 shows a flowchart for distortion suppression by the distortion suppression circuitry of FIG. 6, according to an example embodiment.

Turning also to FIG. 9, a flowchart 900 for distortion suppression processing by distortion suppression system 600 of FIG. 6 is shown, according to an embodiment. That is, distortion suppression system 600 including distortion suppression circuitry 602, along with its subcomponents, may be configured to perform its respective functions in accordance with flowchart 900. Flowchart 900 may be performed in conjunction with flowchart 700 of FIG. 7 and/or flowchart 800 of FIG. 8. Flowchart 900 is described as follows.

The corresponding pre-processed representation is selected when the value of the first characteristic is less than or equal to the value of the second characteristic to suppress the unwanted distortion (902). For example, signal selectors $618_0, 618_1, \ldots,$ and $618_K$ may be configured to select bins associated with pre-processed representations of audio signals when the pre-processed signal characteristic values are less than or equal to the post-processed signal characteristic values. In such cases, pre-processed representations may be preferred as these signals are not processed or altered by processing circuitry such as excursion-constraining processing circuitry 410 of FIG. 4, which may introduce unwanted distortion into post-processed audio signals.

Figure 10:
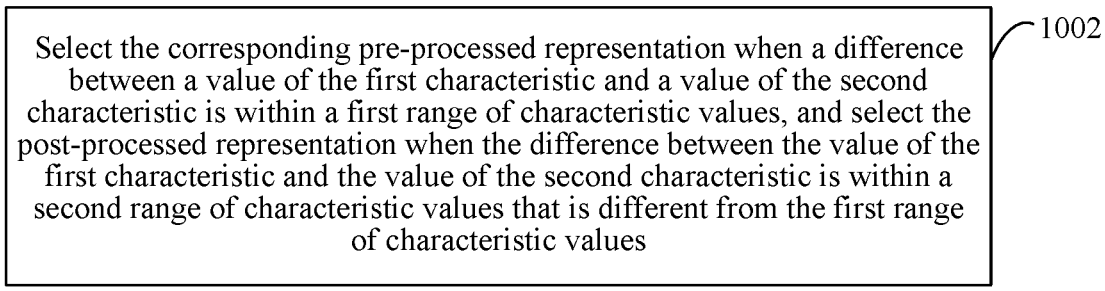
FIG. 10 shows a flowchart for distortion suppression by the distortion suppression circuitry of FIG. 6, according to an example embodiment.

Turning now to FIG. 10, a flowchart 1000 for distortion suppression processing by distortion suppression system 600 of FIG. 6 is shown, according to an embodiment. Distortion suppression system 600 including distortion suppression circuitry 602, along with its subcomponents, may be configured to perform its respective functions in accordance with flowchart 1000. Flowchart 1000 may be performed in conjunction with flowchart 700 of FIG. 7, flowchart 800 of FIG. 8, and/or flowchart 900 of FIG. 9. Flowchart 1000 is described as follows.

The corresponding pre-processed representation is selected when a difference between a value of the first characteristic and a value of the second characteristic is within a first range of characteristic values, and the post-processed representation is selected when the difference between the value of the first characteristic and the value of the second characteristic is within a second range of characteristic values that is different from the first range of characteristic values (1002). As noted above in (708) of flowchart 700, the corresponding pre-processed representation (a bin of $U_{in}(f)$) is selected when a difference between a value of the first characteristic and a value of the second characteristic is within a first range of characteristic values, and the post-processed representation (a bin of $U_{out}(f)$) is selected when the difference between the value of the first characteristic and the value of the second characteristic is within a second range of characteristic values. For example, in embodiments, value comparison circuits $616_0$, $616_1$, ..., and $616_K$ are each configured to determine if a received signal or representation is within a specified range of the other received signal or representation. As an example, given a first characteristic value of 5, a second characteristic value of 7, and a range delta of 3, the bin corresponding to $U_{in}(f)$ is selected because the first characteristic value of 5 is within the range (3) of the second characteristic value of 7. If the range delta was 2, the first characteristic value was 3, and/or the second characteristic value was 8, the bin corresponding to $U_{out}(f)$ is selected. Likewise, in another example, given a first characteristic value of 8, a second characteristic value of 7, and a range delta of 3, the bin corresponding to $U_{in}(f)$ is selected because the first characteristic value of 8 is within the range (3) of the second characteristic value of 7. In other words, given these examples, if the first characteristic value is within a first range of the second characteristic, e.g., [ ..., −2, −1, 0, 1, 2] (corresponding to the range delta), and the first characteristic value is outside of a second range of the second characteristic [3, 4, 5, 6, ...] (also corresponding to the range delta), the bin associated with the signal representation having the first characteristic value is selected, and vice versa.

The ranges and range deltas may be configured to different values according to the embodiments contemplated herein, including non-integer ranges, ranges according to different domains, and/or the like. In embodiments, the first range and the second range are different ranges, and may be mutually exclusive of each other. In embodiments, the ranges may be complementary, or may be non-complementary ranges that are overlapping or non-overlapping. In the case of overlapping, non-complementary ranges where a difference of characteristic values falls between the ranges, additional information may be used by the described selectors to determine which signal is selected, such as, but not limited to, predefined selection preferences for such a case, indicia of other signal characteristics, etc.

Referring again to flowchart 700 of FIG. 7, an output audio signal comprised of the selected portions of the plurality of corresponding, respective portions is generated (710). For instance, combiner 620 of distortion suppression circuitry 602 is configured to combine the selected portions, i.e., signal representations corresponding to selected bins in (708) and/or (808) of the plurality of corresponding, respective portions, to generate an output audio signal representation $U(f)$. In embodiments, combiner 620 provides the generated output audio signal representation $U(f)$ to IFFT 612 for conversion from the frequency domain to the audio signal domain (e.g., the voltage or time domain) to generate output audio signal $u(n)$ having suppressed distortion and provide it via a connector 626.

In embodiments, the distortion-suppressed output audio signal $u(n)$ may be provided for playback by a loudspeaker, such as a microspeaker, via connector 626 from combiner 620 (e.g., via IFFT 612). Such playback may be performed by a user device or mobile device such as a smartphone.

The described circuits and components of distortion suppression system 600 and/or distortion suppression circuitry 602 may be implemented in embodiments using a variety of circuits, electrical components, programmable logic devices, integrated circuits, and/or the like, in embodiments. In some embodiments, the circuits and components of distortion suppression system 600 and/or distortion suppression circuitry 602 may be connected as shown by connectors such as, but not limited to, circuit board traces, intra-circuit connectors and/or traces, vias, direct element connections, other conductive elements, etc.

While exemplary inputs, connectors, and components (e.g., circuit components) are shown in FIG. 6 as an illustrative embodiment, it is contemplated herein that other equivalent and/or alternate inputs, connectors, and components may be included, and that not all shown must be included, in some embodiments. Likewise, the illustrated embodiment may be utilized and/or organized in equivalent and/or alternate configurations, in some embodiments (e.g., one or more elements of distortion suppression system 600 and/or distortion suppression circuitry 602) may be included, grouped, etc., in other portions of the illustrated embodiment).

Audio signals may be sampled for processing and distortion suppression at a sampling rate that corresponds to the type of audio signal (e.g., music audio, speech received by a microphone, voice of internet protocol (VOIP), other telephony signals, audio signals from files or other tangible media, audio accompanying multimedia or video (e.g., movies), commercial digital/audio recordings, etc.), as would be understood by one of skill in the relevant art(s) having the benefit of this disclosure. In one embodiment, a sampling rate of, or approximately of, 44.1 kHz may be used with 1024 or 2048 band frequency bins as noted above, although other rates are contemplated herein as noted.

V. Further Example Embodiments and Advantages

As noted above, systems and devices may be configured in various ways to perform methods for loudspeaker protection according to the techniques and embodiments provided. For instance, in embodiments, upstream loudspeaker model estimation components are configured to receive sensed electrical characteristics of a loudspeaker and generate an impedance model from which an excursion model of the loudspeaker and a gain change parameter may be generated. Downstream processing components may subsequently utilize the gain change parameter and the excursion model (or parameters thereof) to constrain the temperature of a voice coil of the loudspeaker and to limit an excursion of the loudspeaker. Downstream processing components may also utilize processed signals associated with the constrained temperature and the limited excursion to suppress distortion for an output audio signal to be played back by the loudspeaker.

The described embodiments may be configured to use properties of only the measured magnitude impedance (i.e., from the sensed voice coil current and voltage signals) to fit the individual components of the impedance model. This results in a robust, accurate, and low complexity method that is insensitive to the phase of the current and voltage sense signals. That is, such a method uses only the magnitude of the current and voltage magnitude spectra to estimate the magnitude spectrum of the impedance. Additionally, this method converges quickly and is not subject to typical convergence issues of adaptive filters. The disclosed embodiments and processing to constrain diaphragm or cone displacement (i.e., excursions) is effectively a unique non-linear filter, that is highly effective in combination with the described distortion suppression method to constrain the diaphragm displacement, minimize distortion to the signal, and yet maintain good loudness of the played-back audio signal.

Furthermore, the techniques and embodiments herein cover more than just the basic properties of the physical system made up of the loudspeaker—rather the described techniques and embodiments are capable of modeling unique features of device loudspeakers, such as microspeakers, mounted in devices. For instance, device loudspeakers may produce an impedance with two resonances (e.g., a primary resonance and a secondary resonance). The present techniques and embodiments are capable of modeling both the primary and the secondary resonance of such loudspeakers.

In embodiments, one or more of the operations of any flowchart described herein may not be performed. Moreover, operations in addition to or in lieu of any flowchart described herein may be performed. Further, in embodiments, one or more operations of any flowchart described herein may be performed out of order, in an alternate sequence, or partially (or completely) concurrently with each other or with other operations.

A "connector," as used herein, may refer to a hardware connection or a software connection for the transfer of data, instructions, and/or information, according to embodiments.

The further example embodiments and advantages described in this Section may be applicable to embodiments disclosed in any other Section of this disclosure.

Embodiments and techniques, including methods, described herein may be performed in various ways such as, but not limited to, being implemented in hardware, or hardware combined with one or both of software and firmware. For example, embodiments may be implemented in systems and devices, as well as specifically customized hardware, application specific integrated circuits (ASICs), field programmable gate arrays (FPGAs), digital signal processors (DSPs), etc., electrical circuitry, and/or the like.

VI. Example Computer Implementations

Loudspeaker protection system 100A of FIG. 1A, device 100B of FIG. 1B, microspeaker 100C of FIG. 1C, upstream loudspeaker model estimation component 200 of FIG. 2, downstream audio signal processing component 400 of FIG. 4, and/or distortion suppression circuitry 600 of FIG. 6, along with any respective components/subcomponents thereof, and/or any flowcharts, further systems, sub-systems, and/or components disclosed herein may be implemented in hardware (e.g., hardware logic/electrical circuitry), or any combination of hardware with one or both of software (computer program code or instructions configured to be executed in one or more processors or processing devices) and firmware.

Figure 11:
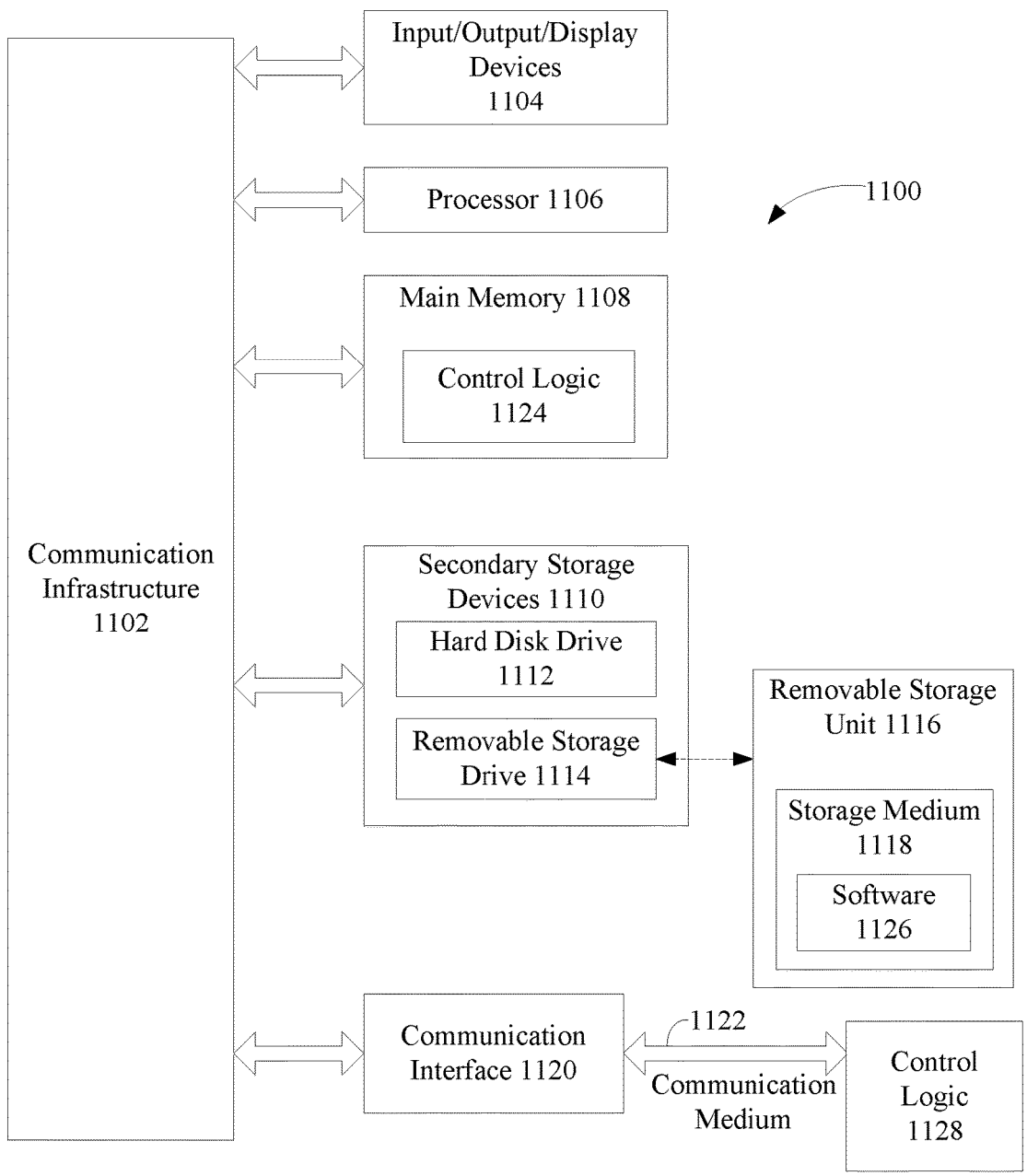
FIG. 11 shows a block diagram of a computing device/system in which the techniques disclosed herein may be performed and the example embodiments herein may be utilized.

The embodiments described herein, including circuitry, devices, systems, methods/processes, and/or apparatuses, may be implemented in or using well known processing devices, communication systems, servers, and/or, computers, such as a processing device 1100 shown in FIG. 11. It should be noted that processing device 1100 may represent communication devices/systems (e.g., device 100B), entertainment systems/devices, processing devices, and/or traditional computers in one or more embodiments. For example, loudspeaker protection systems and devices, and any of the sub-systems and/or components respectively contained therein and/or associated therewith, may be implemented in or using one or more processing devices 1100 and similar computing devices.

Processing device 1100 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1100 may be any type of computer, including a desktop computer, a server, etc., and may be a computing device or system within another device or system.

Processing device 1100 includes one or more processors (also called central processing units, or CPUs), such as a processor 1106. Processor 1106 is connected to a communication infrastructure 1102, such as a communication bus. In some embodiments, processor 1106 can simultaneously operate multiple computing threads, and in some embodiments, processor 1106 may comprise one or more processors.

Processing device 1100 also includes a primary or main memory 1108, such as random access memory (RAM). Main memory 1108 has stored therein control logic 1124 (computer software), and data.

Processing device 1100 also includes one or more secondary storage devices 1110. Secondary storage devices 1110 include, for example, a hard disk drive 1112 and/or a removable storage device or drive 1114, as well as other types of storage devices, such as memory cards and memory sticks. For instance, processing device 1100 may include an industry standard interface, such a universal serial bus (USB) interface for interfacing with devices such as a memory stick. Removable storage drive 1114 represents a floppy disk drive, a magnetic tape drive, a compact disk drive, an optical storage device, tape backup, etc.

Removable storage drive 1114 interacts with a removable storage unit 1116. Removable storage unit 1116 includes a computer useable or readable storage medium 1118 having stored therein computer software 1126 (control logic) and/or data. Removable storage unit 1116 represents a floppy disk, magnetic tape, compact disk, DVD, optical storage disk, or any other computer data storage device. Removable storage drive 1114 reads from and/or writes to removable storage unit 1116 in a well-known manner.

Processing device 1100 also includes input/output/display devices 1104, such as touchscreens, LED and LCD displays, monitors, keyboards, pointing devices, etc.

Processing device 1100 further includes a communication or network interface 1120. Communication interface 1120 enables processing device 1100 to communicate with remote devices. For example, communication interface 1120 allows processing device 1100 to communicate over communication networks or mediums 1122 (representing a form of a computer useable or readable medium), such as LANs, WANs, the Internet, etc. Network interface 1120 may interface with remote sites or networks via wired or wireless connections.

Control logic 1128 may be transmitted to and from processing device 1100 via the communication medium 1122.

Any apparatus or manufacture comprising a computer useable or readable medium having control logic (software) stored therein is referred to herein as a computer program product or program storage device. This includes, but is not limited to, processing device 1100, main memory 1108, secondary storage devices 1110, and removable storage unit 1116. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media and propagating signals (do not include communication media and propagating signals). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 11) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1106 of FIG. 11), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VII. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A system comprising:
   excursion-constraining processing circuitry configured to receive and process a pre-processed representation of an audio signal and generate a post-processed representation of the audio signal; and
   distortion suppression circuitry to suppress distortion in audio signals, the distortion suppression circuitry configured to:
   receive the pre-processed representation of the audio signal;
   receive the post-processed representation of the audio signal;
   determine a first characteristic of the pre-processed representation of the audio signal and a second characteristic of the post-processed representation of the audio signal;
   for each of a plurality of corresponding, respective portions of the pre-processed representation and of the post-processed representation, select one of the corresponding pre-processed representation portion or the post-processed representation portion for inclusion in an audio output signal based on the first characteristic of the pre-processed representation of the audio signal and the second characteristic of the post-processed representation of the audio signal, wherein an unselected one of the pre-processed representation portion or the post-processed representation portion is not included in the audio output signal; and generate the audio output signal comprised of the selected portions of the plurality of corresponding, respective portions.

2. The system of claim 1, wherein the plurality of corresponding, respective portions of the pre-processed representation and of the post-processed representation comprise frequency bins, and wherein the first characteristic of the pre-processed representation of the audio signal and the second characteristic of the post-processed representation of the audio signal each correspond to a frequency domain energy.

3. The system of claim 1, wherein the system is a loudspeaker protection system, and wherein the post-processed representation of the audio signal has been processed by audio signal processing circuitry comprising a non-linear constraint filter that is configured to limit an excursion of a loudspeaker.

4. The system of claim 3, wherein the loudspeaker is a microspeaker of a mobile device.

5. The system of claim 3, wherein the audio signal processing circuitry introduces unwanted distortion into the post-processed representation of the audio signal, and wherein the distortion suppression circuitry is configured to select the corresponding pre-processed representation when a value of the first characteristic of the pre-processed representation of the audio signal is less than or equal to a value of the second characteristic of the post-processed representation of the audio signal, and to select the post-processed representation otherwise.

6. The system of claim 1, wherein the distortion suppression circuitry is configured to:

select the corresponding pre-processed representation when a difference between a value of the first characteristic of the pre-processed representation of the audio signal and a value of the second characteristic of the post-processed representation of the audio signal is within a first range of characteristic values, and select the post-processed representation when the difference between the value of the first characteristic of the pre-processed representation of the audio signal and the value of the second characteristic of the post-processed representation of the audio signal is within a second range of characteristic values that is different from the first range of characteristic values.

7. The system of claim 6, the distortion suppression circuitry further comprising for said each of the plurality of corresponding, respective portions:

a comparison circuit configured to compare the value of the first characteristic of the pre-processed representation of the audio signal and the value of the second characteristic of the post-processed representation of the audio signal; and a signal selector configured to select the pre-processed portion or the post-processed portion based on the comparing.

8. The system of claim 1, further comprising:

a first value determination circuit configured to determine a value of the first characteristic of the pre-processed representation of the audio signal;

a first bin circuit configured to divide the pre-processed representation into a plurality of pre-processed portions; a second value determination circuit configured to determine a value of the second characteristic of the post-processed representation of the audio signal; and a second bin circuit configured to divide the post-processed representation into a plurality of post-processed portions.

9. The system of claim 1, wherein the plurality of corresponding, respective portions of the pre-processed representation and of the post-processed representation comprise portions of a representation of the audio signal, a loudspeaker excursion signal, or a sound pressure signal.

10. The system of claim 3, wherein the pre-processed representation of the audio signal has not been processed by the audio signal processing circuitry comprising the non-linear constraint filter that is configured to limit the excursion of the loudspeaker.

11. A method for suppressing distortion in an audio signal, comprising:

receiving a pre-processed representation of the audio signal;

receiving a post-processed representation of the audio signal;

determining a first characteristic of the pre-processed representation of the audio signal and a second characteristic of the post-processed representation of the audio signal;

for each of a plurality of corresponding, respective portions of the pre-processed representation and of the post-processed representation, selecting one of the corresponding pre-processed representation portion or the post-processed representation portion for inclusion in an audio output signal based on the first characteristic of the pre-processed representation of the audio signal and the second characteristic of the post-processed representation of the audio signal, wherein an unselected one of the preprocessed representation portion or the post-processed representation portion is not included in the audio output signal; and generating the audio output signal comprised of the selected portions of the plurality of corresponding, respective portions.

12. The method for suppressing distortion in the audio signal of claim 11, wherein the plurality of corresponding, respective portions of the pre-processed representation and of the post-processed representation comprise frequency bins, and wherein the first characteristic of the pre-processed representation of the audio signal and the second characteristic of the post-processed representation of the audio signal each correspond to a frequency domain energy.

13. The method for suppressing distortion in the audio signal of claim 11, wherein the post-processed representation of the audio signal has been processed by audio signal processing circuitry comprising a non-linear constraint filter that is configured to limit an excursion of a loudspeaker.

14. The method for suppressing distortion in the audio signal of claim 13, wherein the loudspeaker is a microspeaker of a mobile device.

15. The method for suppressing distortion in the audio signal of claim 13, wherein unwanted distortion is introduced by audio signal processing circuitry into the post-processed representation of the audio signal, the method further comprising:

selecting the corresponding pre-processed representation when a value of the first characteristic of the pre-processed representation of the audio signal is less than or equal to a value of the second characteristic of the post-processed representation of the audio signal, and selecting the post-processed representation otherwise.

16. The method for suppressing distortion in the audio signal of claim 11, wherein selecting one of the corresponding pre-processed representation and the post-processed representation based on the first characteristic of the pre-processed representation of the audio signal and the second characteristic of the post-processed representation of the audio signal comprises:
selecting the corresponding pre-processed representation when a difference between a value of the first characteristic of the pre-processed representation of the audio signal and a value of the second characteristic of the post-processed representation of the audio signal is within a first range of characteristic values, and selecting the post-processed representation when the difference between the value of the first characteristic of the pre-processed representation of the audio signal and the value of the second characteristic of the post-processed representation of the audio signal is within a second range of characteristic values that is different from the first range of characteristic values.

17. The method for suppressing distortion in the audio signal of claim 16, further comprising:
for said each of the plurality of corresponding, respective portions:
comparing the value of the first characteristic of the pre-processed representation of the audio signal and the value of the second characteristic of the post-processed representation of the audio signal; and
selecting the pre-processed portion or the post-processed portion based on the comparing.

18. The method for suppressing distortion in the audio signal of claim 11, further comprising:
determining a value of the first characteristic of the pre-processed representation of the audio signal;
dividing the pre-processed representation into a plurality of pre-processed portions;
determining a value of the second characteristic of the post-processed representation of the audio signal; and
dividing the post-processed representation into a plurality of post-processed portions.

19. The method for suppressing distortion in the audio signal of claim 11, wherein the plurality of corresponding, respective portions of the pre-processed representation and of the post-processed representation comprise portions of a representation of an audio signal, a loudspeaker excursion signal, or a sound pressure signal.

20. The method for suppressing distortion in the audio signal of claim 13, wherein the pre-processed representation of the audio signal has not been processed by the audio signal processing circuitry comprising the non-linear constraint filter that is configured to limit the excursion of the loudspeaker.

* * * * *

UNITED STATES PATENT AND TRADEMARK OFFICE
CERTIFICATE OF CORRECTION

PATENT NO. : 10,397,700 B2
APPLICATION NO. : 15/365268
DATED : August 27, 2019
INVENTOR(S) : Jes Thyssen Page 1 of 1

It is certified that error appears in the above-identified patent and that said Letters Patent is hereby corrected as shown below:

In the Claims

In Column 34, Line 41, please replace, "preprocessed representation" with --pre-processed representation--.

Signed and Sealed this
Third Day of December, 2019

Andrei Iancu
*Director of the United States Patent and Trademark Office*